(12) United States Patent
Russell et al.

(10) Patent No.: US 8,455,341 B2
(45) Date of Patent: Jun. 4, 2013

(54) METHODS OF FORMING FEATURES OF INTEGRATED CIRCUITRY

(75) Inventors: Stephen W. Russell, Boise, ID (US); Kyle A. Armstrong, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 137 days.

(21) Appl. No.: 12/874,781

(22) Filed: Sep. 2, 2010

(65) Prior Publication Data
US 2012/0058633 A1 Mar. 8, 2012

(51) Int. Cl.
*H01L 21/4763* (2006.01)
*H01L 21/3205* (2006.01)

(52) U.S. Cl.
USPC ............................................ 438/585; 438/593

(58) Field of Classification Search
USPC ................................................. 438/585, 593
See application file for complete search history.

(56) References Cited

U.S. PATENT DOCUMENTS

| | | |
|---|---|---|
| 5,047,117 A | 9/1991 | Roberts |
| 5,254,218 A | 10/1993 | Roberts et al. |
| 5,328,810 A | 7/1994 | Lowrey et al. |
| 5,372,916 A | 12/1994 | Ogawa et al. |
| 5,382,315 A | 1/1995 | Kumar |
| 5,420,067 A | 5/1995 | Hsu |
| 5,429,988 A | 7/1995 | Huang et al. |
| 5,573,837 A | 11/1996 | Roberts et al. |
| 5,593,813 A | 1/1997 | Kim |
| 5,616,510 A | 4/1997 | Wong |
| 5,905,279 A | 5/1999 | Nitayama et al. |
| 6,063,688 A | 5/2000 | Doyle et al. |
| 6,087,263 A | 7/2000 | Clampitt et al. |
| 6,140,217 A | 10/2000 | Jones et al. |
| 6,207,490 B1 | 3/2001 | Lee |
| 6,235,574 B1 * | 5/2001 | Tobben et al. ............... 438/241 |
| 6,249,335 B1 | 6/2001 | Hirukawa et al. |
| 6,303,272 B1 | 10/2001 | Furukawa et al. |
| 6,352,932 B1 | 3/2002 | Clampitt et al. |
| 6,383,952 B1 | 5/2002 | Subramanian et al. |
| 6,483,136 B1 | 11/2002 | Yoshida et al. |
| 6,545,904 B2 | 4/2003 | Tran |
| 6,548,401 B1 | 4/2003 | Trivedi |

(Continued)

FOREIGN PATENT DOCUMENTS

| CN | 1761063 | 4/2006 |
|---|---|---|
| EP | 0171111 | 2/1986 |

(Continued)

OTHER PUBLICATIONS

U.S. Appl. No. 13/101,485, filed May 5, 2011, Light et al.

(Continued)

*Primary Examiner* — Luan C Thai
(74) *Attorney, Agent, or Firm* — Wells St. John, P.S.

(57) ABSTRACT

Methods of forming features such as word lines of memory circuitry are disclosed. One such method includes forming an initial pitch multiplied feature pattern extending from a target area into only one of a first or second periphery area received on opposing sides of the target area. Thereafter, a subsequent feature pattern is formed which extends from the target array area into the other of the first or second periphery area. The initial and subsequent feature patterns may be used in forming features in an underlying material which extend from the target area to the first and second periphery areas. Other embodiments are disclosed.

28 Claims, 21 Drawing Sheets

U.S. PATENT DOCUMENTS

| | | |
|---|---|---|
| 6,566,280 B1 | 5/2003 | Meagley et al. |
| 6,580,136 B2 | 6/2003 | Mandelman et al. |
| 6,599,844 B2 | 7/2003 | Koh et al. |
| 6,605,541 B1 | 8/2003 | Yu |
| 6,627,524 B2 | 9/2003 | Scott |
| 6,630,379 B2 | 10/2003 | Mandelman et al. |
| 6,638,441 B2 | 10/2003 | Chang et al. |
| 6,649,956 B2 | 11/2003 | Yoshida et al. |
| 6,667,502 B1 | 12/2003 | Agarwal et al. |
| 6,703,323 B2 | 3/2004 | Kong et al. |
| 6,710,390 B2 | 3/2004 | Parekh et al. |
| 6,735,132 B2 | 5/2004 | Siek |
| 6,753,220 B2 | 6/2004 | Juengling |
| 6,756,619 B2 | 6/2004 | Tran |
| 6,826,069 B2 | 11/2004 | Kurjanowicz et al. |
| 6,864,184 B1 | 3/2005 | Gabriel |
| 6,872,512 B2 | 3/2005 | Yamashita |
| 6,905,975 B2 | 6/2005 | Boettiger et al. |
| 6,916,594 B2 | 7/2005 | Bok et al. |
| 6,951,822 B2 | 10/2005 | Scholz |
| 7,037,840 B2 | 5/2006 | Katz |
| 7,042,038 B2 | 5/2006 | Yoshida et al. |
| 7,049,652 B2 | 5/2006 | Mokhlesi et al. |
| 7,064,376 B2 | 6/2006 | Shau |
| 7,067,385 B2 | 6/2006 | Manning |
| 7,098,105 B2 | 8/2006 | Juengling |
| 7,115,525 B2 | 10/2006 | Abatchev et al. |
| 7,125,781 B2 | 10/2006 | Manning et al. |
| 7,151,040 B2 | 12/2006 | Tran et al. |
| 7,166,533 B2 | 1/2007 | Happ |
| 7,199,005 B2 | 4/2007 | Sandhu et al. |
| 7,202,127 B2 | 4/2007 | Musch et al. |
| 7,202,174 B1 | 4/2007 | Jung et al. |
| 7,230,292 B2 | 6/2007 | Graettinger |
| 7,253,118 B2 | 8/2007 | Tran et al. |
| 7,314,810 B2 | 1/2008 | Jung et al. |
| 7,320,911 B2 | 1/2008 | Basceri et al. |
| 7,387,939 B2 | 6/2008 | Manning |
| 7,390,749 B2 | 6/2008 | Kim et al. |
| 7,396,781 B2 | 7/2008 | Wells |
| 7,439,152 B2 | 10/2008 | Manning |
| 7,442,976 B2 | 10/2008 | Juengling |
| 7,517,753 B2 | 4/2009 | Manning |
| 7,521,371 B2 | 4/2009 | DeBruler |
| 7,521,378 B2 | 4/2009 | Fucsko et al. |
| 7,537,866 B2 | 5/2009 | King Liu |
| 7,544,563 B2 | 6/2009 | Manning |
| 7,553,760 B2 | 6/2009 | Yang et al. |
| 7,557,013 B2 | 7/2009 | Bhat et al. |
| 7,557,015 B2 | 7/2009 | Sandhu et al. |
| 7,682,924 B2 | 3/2010 | Bhat et al. |
| 7,687,387 B2 * | 3/2010 | Inaba et al. ............. 438/585 |
| 7,696,076 B2 * | 4/2010 | Jung et al. ............. 438/593 |
| 7,713,818 B2 | 5/2010 | Chan |
| 7,790,357 B2 | 9/2010 | Jung |
| 7,790,360 B2 | 9/2010 | Alapati et al. |
| 7,842,601 B2 | 11/2010 | Lee et al. |
| 7,851,135 B2 | 12/2010 | Jung et al. |
| 7,923,371 B2 | 4/2011 | Shinohe |
| 7,959,818 B2 * | 6/2011 | Jung ..................... 216/46 |
| 8,083,953 B2 | 12/2011 | Millward et al. |
| 8,083,958 B2 | 12/2011 | Li et al. |
| 8,148,052 B2 | 4/2012 | Vanleenhove et al. |
| 2002/0037617 A1 | 3/2002 | Kim et al. |
| 2002/0094688 A1 | 7/2002 | Mitsuiki |
| 2003/0001214 A1 | 1/2003 | Yoshida et al. |
| 2003/0006410 A1 | 1/2003 | Doyle |
| 2003/0091936 A1 | 5/2003 | Rottstegge et al. |
| 2004/0043546 A1 | 3/2004 | Yoshida et al. |
| 2004/0198065 A1 | 10/2004 | Lee et al. |
| 2005/0130068 A1 | 6/2005 | Kondoh et al. |
| 2005/0142497 A1 * | 6/2005 | Ryou et al. ............. 430/311 |
| 2005/0164478 A1 | 7/2005 | Chan et al. |
| 2005/0173740 A1 | 8/2005 | Jin |
| 2005/0255696 A1 | 11/2005 | Makiyama et al. |
| 2005/0272220 A1 | 12/2005 | Waldfried et al. |
| 2006/0011947 A1 | 1/2006 | Juengling |
| 2006/0046200 A1 | 3/2006 | Abatchev et al. |
| 2006/0046422 A1 | 3/2006 | Tran et al. |
| 2006/0046484 A1 | 3/2006 | Abatchev et al. |
| 2006/0088788 A1 | 4/2006 | Kudo et al. |
| 2006/0115978 A1 | 6/2006 | Specht et al. |
| 2006/0118785 A1 | 6/2006 | Allen et al. |
| 2006/0154182 A1 | 7/2006 | Brodsky |
| 2006/0240361 A1 | 10/2006 | Lee et al. |
| 2006/0262511 A1 | 11/2006 | Abatchev et al. |
| 2006/0273456 A1 | 12/2006 | Sant et al. |
| 2006/0278911 A1 | 12/2006 | Eppich |
| 2006/0286795 A1 | 12/2006 | Yosho |
| 2007/0003878 A1 | 1/2007 | Paxton et al. |
| 2007/0010058 A1 | 1/2007 | Juengling |
| 2007/0020565 A1 | 1/2007 | Koh et al. |
| 2007/0023805 A1 | 2/2007 | Wells et al. |
| 2007/0026684 A1 | 2/2007 | Parascandola et al. |
| 2007/0037066 A1 | 2/2007 | Hsiao |
| 2007/0045712 A1 | 3/2007 | Haller et al. |
| 2007/0048674 A1 | 3/2007 | Wells |
| 2007/0048930 A1 | 3/2007 | Figura et al. |
| 2007/0049003 A1 | 3/2007 | Smythe |
| 2007/0049011 A1 | 3/2007 | Tran |
| 2007/0049030 A1 | 3/2007 | Sandhu et al. |
| 2007/0049035 A1 | 3/2007 | Makoto et al. |
| 2007/0049040 A1 | 3/2007 | Bai et al. |
| 2007/0077524 A1 | 4/2007 | Koh et al. |
| 2007/0077743 A1 | 4/2007 | Rao et al. |
| 2007/0085152 A1 | 4/2007 | Butler et al. |
| 2007/0096182 A1 | 5/2007 | Schloesser et al. |
| 2007/0099431 A1 | 5/2007 | Li |
| 2007/0105357 A1 | 5/2007 | Nejad et al. |
| 2007/0123015 A1 | 5/2007 | Chinthakindi et al. |
| 2007/0145464 A1 | 6/2007 | Voshell et al. |
| 2007/0148984 A1 | 6/2007 | Abatchev et al. |
| 2007/0161251 A1 | 7/2007 | Tran et al. |
| 2007/0181929 A1 | 8/2007 | Juengling |
| 2007/0190463 A1 | 8/2007 | Sandhu et al. |
| 2007/0197014 A1 | 8/2007 | Jeon et al. |
| 2007/0202671 A1 | 8/2007 | Jung |
| 2007/0202697 A1 | 8/2007 | Jung |
| 2007/0205438 A1 | 9/2007 | Juengling |
| 2007/0205443 A1 | 9/2007 | Juengling |
| 2007/0224537 A1 | 9/2007 | Nozaki et al. |
| 2007/0238053 A1 * | 10/2007 | Hashimoto ............. 430/313 |
| 2007/0238299 A1 | 10/2007 | Niroomand et al. |
| 2007/0248916 A1 | 10/2007 | Kamijima |
| 2007/0264828 A1 | 11/2007 | Jung et al. |
| 2007/0264830 A1 | 11/2007 | Huang et al. |
| 2007/0278183 A1 | 12/2007 | Lee et al. |
| 2007/0281219 A1 | 12/2007 | Sandhu |
| 2007/0281488 A1 | 12/2007 | Wells et al. |
| 2007/0281493 A1 | 12/2007 | Fucsko et al. |
| 2008/0002475 A1 | 1/2008 | Yang et al. |
| 2008/0008969 A1 | 1/2008 | Zhou et al. |
| 2008/0026327 A1 | 1/2008 | Koo |
| 2008/0032243 A1 | 2/2008 | Jung |
| 2008/0032508 A1 | 2/2008 | Chang |
| 2008/0044770 A1 | 2/2008 | Nozaki et al. |
| 2008/0057692 A1 | 3/2008 | Wells et al. |
| 2008/0063986 A1 * | 3/2008 | Jung ..................... 430/312 |
| 2008/0064213 A1 | 3/2008 | Jung |
| 2008/0070165 A1 | 3/2008 | Fischer et al. |
| 2008/0076070 A1 | 3/2008 | Koh et al. |
| 2008/0085612 A1 | 4/2008 | Smythe et al. |
| 2008/0090416 A1 | 4/2008 | Raghu et al. |
| 2008/0113483 A1 | 5/2008 | Wells |
| 2008/0113511 A1 | 5/2008 | Park et al. |
| 2008/0122125 A1 | 5/2008 | Zhou |
| 2008/0171438 A1 | 7/2008 | Sinha et al. |
| 2008/0171446 A1 | 7/2008 | Kim et al. |
| 2008/0176152 A1 | 7/2008 | Hah et al. |
| 2008/0176406 A1 | 7/2008 | Ikeda et al. |
| 2008/0199806 A1 | 8/2008 | Hatakeyama et al. |
| 2008/0199814 A1 | 8/2008 | Brzozowy et al. |
| 2008/0206950 A1 | 8/2008 | Bhat et al. |
| 2008/0210900 A1 | 9/2008 | Wojtczak et al. |
| 2008/0220600 A1 | 9/2008 | Alapati et al. |
| 2008/0254627 A1 | 10/2008 | Wells |
| 2008/0261349 A1 | 10/2008 | Abatchev et al. |

| | | | |
|---|---|---|---|
| 2008/0292991 A1 | 11/2008 | Wallow et al. | |
| 2008/0296732 A1 | 12/2008 | Olson | |
| 2008/0305636 A1 | 12/2008 | Kim et al. | |
| 2009/0074958 A1 | 3/2009 | Xiao | |
| 2009/0108415 A1 | 4/2009 | Lenski et al. | |
| 2009/0117739 A1 | 5/2009 | Shin et al. | |
| 2009/0130601 A1 | 5/2009 | Jeon | |
| 2009/0130612 A1 | 5/2009 | Yang | |
| 2009/0130852 A1 | 5/2009 | Kewley | |
| 2009/0212016 A1 | 8/2009 | Cheng et al. | |
| 2009/0291397 A1 | 11/2009 | deVilliers | |
| 2009/0298274 A1 | 12/2009 | Kajiwara | |
| 2010/0009512 A1 | 1/2010 | Fishburn | |
| 2010/0028809 A1 | 2/2010 | Vanleenhove et al. | |
| 2010/0068656 A1 | 3/2010 | Yeh et al. | |
| 2010/0081265 A1* | 4/2010 | Mashita et al. | 438/586 |
| 2010/0130015 A1 | 5/2010 | Nakajima et al. | |
| 2010/0130016 A1 | 5/2010 | deVilliers | |
| 2010/0144150 A1 | 6/2010 | Sills et al. | |
| 2010/0144151 A1 | 6/2010 | Sills et al. | |
| 2010/0144153 A1 | 6/2010 | Sills et al. | |
| 2010/0203740 A1 | 8/2010 | Li | |
| 2011/0127677 A1 | 6/2011 | Konishi | |

FOREIGN PATENT DOCUMENTS

| | | |
|---|---|---|
| JP | 56046531 | 4/1981 |
| JP | 58157135 | 9/1983 |
| JP | 59211231 | 11/1984 |
| JP | 64035916 | 3/1989 |
| JP | 3270227 | 12/1991 |
| JP | 06-077180 | 3/1994 |
| JP | 6275577 | 9/1994 |
| JP | 2002-217170 | 8/2002 |
| JP | 2003234279 | 8/2003 |
| JP | 2004134574 | 4/2004 |
| JP | 2004247399 | 9/2004 |
| JP | 2006245625 | 9/2006 |
| JP | 2007017993 | 1/2007 |
| JP | 2007305976 | 11/2007 |
| JP | 2008-072097 | 3/2008 |
| JP | 2009289974 | 12/2009 |
| KR | 20030049198 | 6/2003 |
| KR | 20030056601 | 7/2003 |
| KR | 20030089063 | 11/2003 |
| KR | 4025289 | 3/2004 |
| KR | 20040057582 | 7/2004 |
| KR | 10-2007-0076793 | 7/2007 |
| KR | 10-2007-0122049 | 12/2007 |
| KR | 10-0784062 | 12/2007 |
| KR | 10-2008-0039006 | 5/2008 |
| KR | 20080038963 | 5/2008 |
| TW | 098113229 | 9/2012 |
| WO | WO2007/027558 | 3/2007 |
| WO | 2008/008338 | 1/2008 |
| WO | 2008/059440 | 5/2008 |

OTHER PUBLICATIONS

PCT/US2007/015729, Jan. 2, 2008, Written Opinion.
PCT/US2009/041500, Dec. 2, 2010, IPRP.
PCT/US2009/063978, Jun. 16, 2011, IPRP.
PCT/US2009/063999, Jun. 16, 2011, IPRP.
PCT/US2009/064004, Jun. 16, 2011, IPRP.
PCT/US2010/055488, Jun. 27, 2011, Written Opinion.
PCT/US2010/055488, Jun. 27, 2011, Search Report.
PCT/US2007/015729, Jan. 2, 2008, Search Report.
PCT/US2009/039793, Oct. 30, 2009.
PCT/US2009/039793, Oct. 30, 2009, Search Report.
PCT/US2009/039793, Nov. 18, 2010, IPRP.
PCT/US2009/041500, Dec. 7, 2009, Written Opinion.
PCT/US2009/041500, Dec. 7, 2009, Search Report.
PCT/US2009/063978, May 31, 2010, Written Opinion.
PCT/US2009/063978, May 31, 2010, Search Report.
PCT/US2009/063999, May 31, 2010, Written Opinion.
PCT/US2009/063999, May 31, 2010, Search Report.
PCT/US2009/064004, May 31, 2010, Written Opinion.
PCT/US2009/064004, May 31, 2010, Search Report.
PCT/US2010/025495, Sep. 29, 2010, Written Opinion.
PCT/US2010/025495, Sep. 29, 2010, Search Report.
Clariant, Polysilazane SODs Spinful 400 Series for STI/PMD Application; Oct. 19, 2009; 1 pp.
EE et al., "Innovative Solutions to Enhance the Legacy Equipments Towards One Generation Ahead in Flip Chip BGA 0.8mm Ball Pitch Technology", Sep. 2005; 4 pp.
Fritze et al., "Enhanced Resosulation for Future Fabrication", Jan. 2003, 5 pp.
Gallia et al., "A Flexible Gate Array Architecture for High-speed and High-Density Applications", Mar. 1996, pp. 430-436.
Hori et al., "Sub-40nm Half-Pitch Double Patterning with Resist Freezing Process", 2008 8 pp.
Lee et al., "Double-Patterning Technique Using Plasma Treatment of Photoresist", Sep. 20, 2007, 5 pp.
Liau et al., "Softbake and Post-exposure Bake Optimization for Process Window Improvement and Optical Proximity Effect Tuning", 2006, 7 pp.
Lu, "Advanced Cell Structuresw for Dynamic RAMs", Jan. 1989, pp. 27-36.
Ma, "Plasma Resist Image Stabilization Technique (PRIST)", 1980, 2 pp.
Owa et al., "Immersion Lithography Ready for 45nm Manufacturing and Beyond", 2007, pp. 238-244.
Pease et al., "Lithography and Other Patterning Techniques for Future Electronics", Feb. 2008, pp. 248-270.
Tan et al., "Current Status of Nanonex Nanoimprint Solutions", 2004, 9 pp.
Terai et al., "Newly developed RELACS Process and materials for 64 nm node device and beyond", pp. 20-21.
U.S. Appl. No. 11/714,378, Preliminary Amendment dated Mar. 5, 2007, 13 pages.
PCT/US2010/025495, Sep. 27, 2011, IPRP.

* cited by examiner

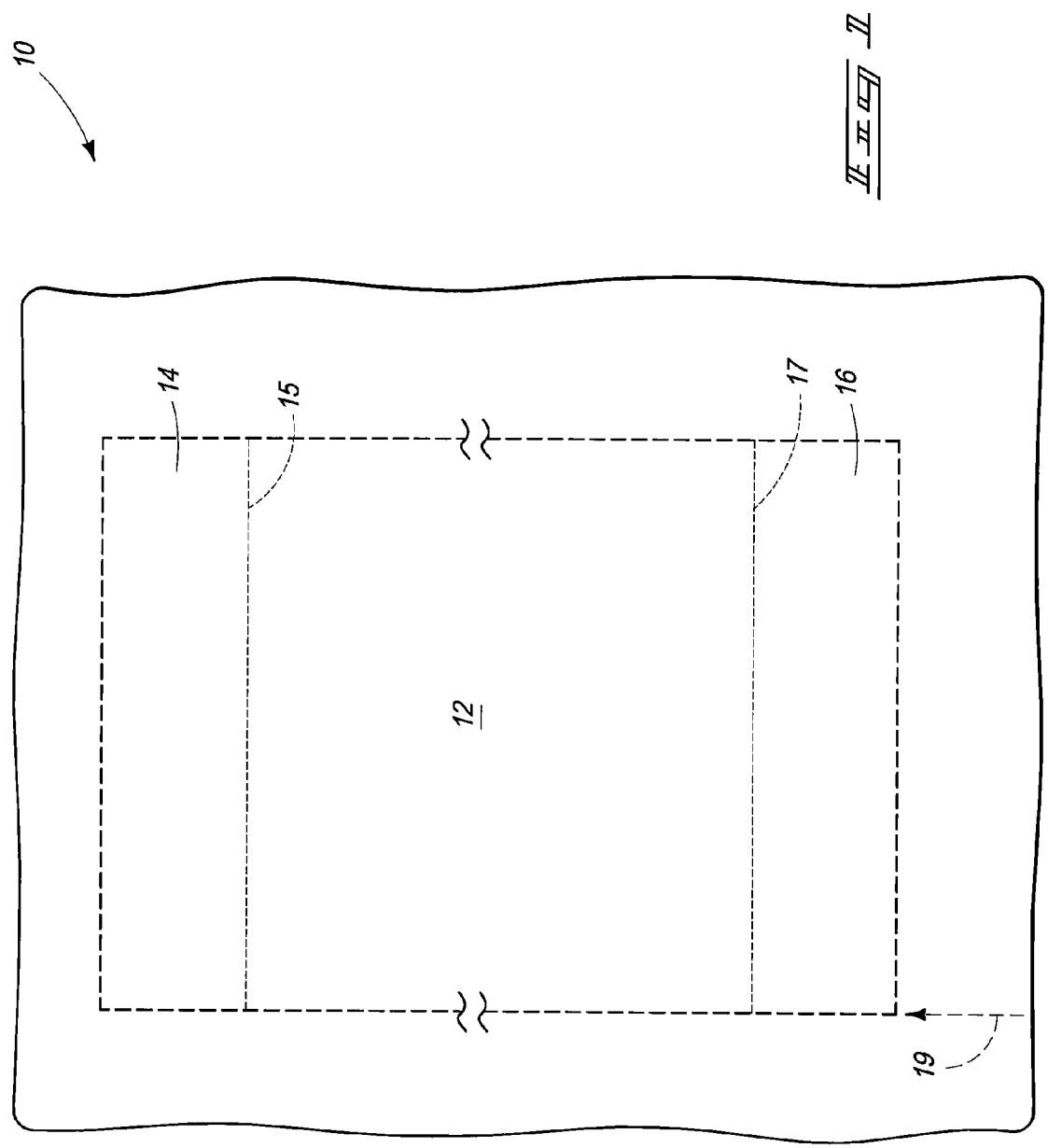

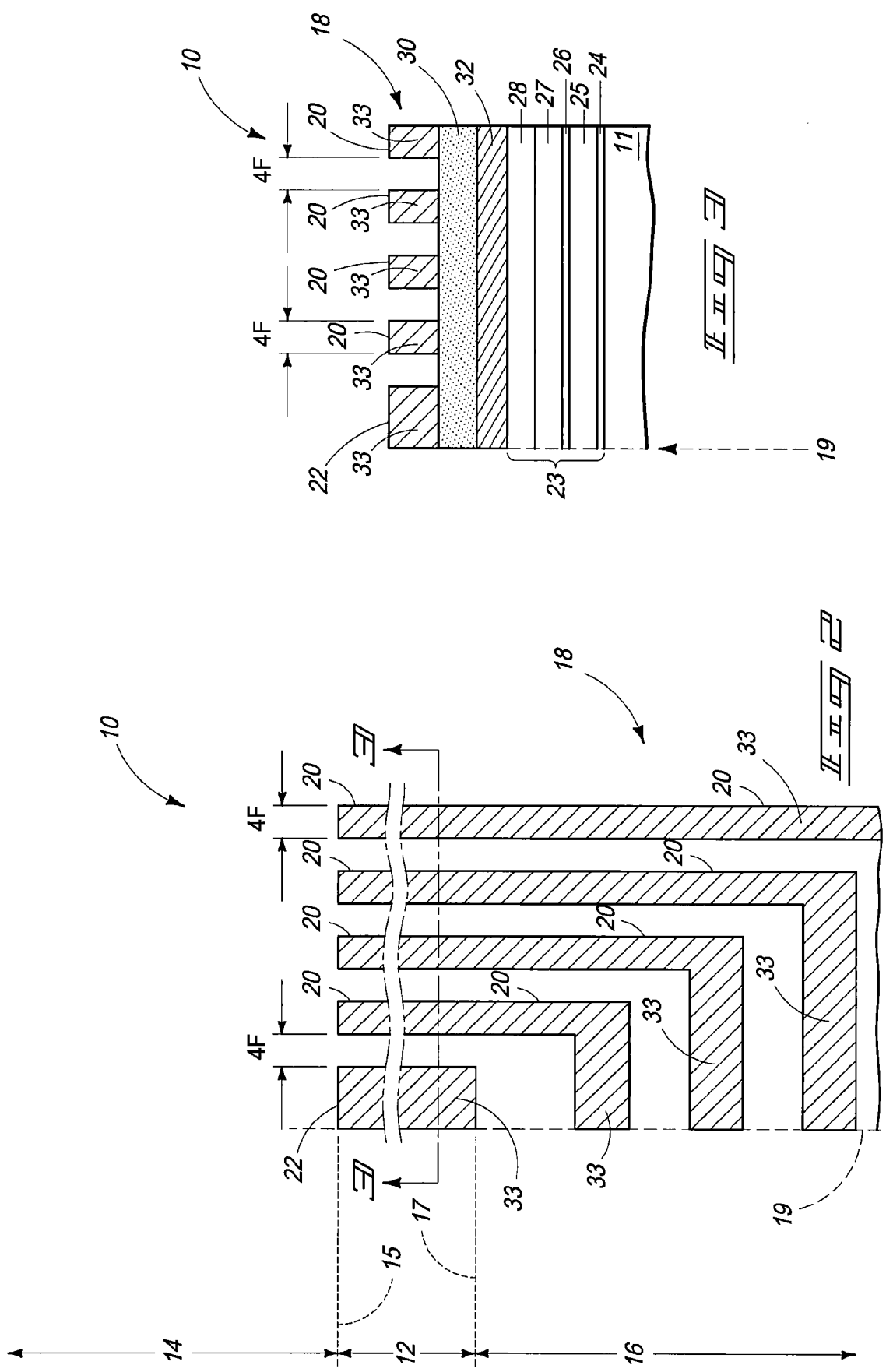

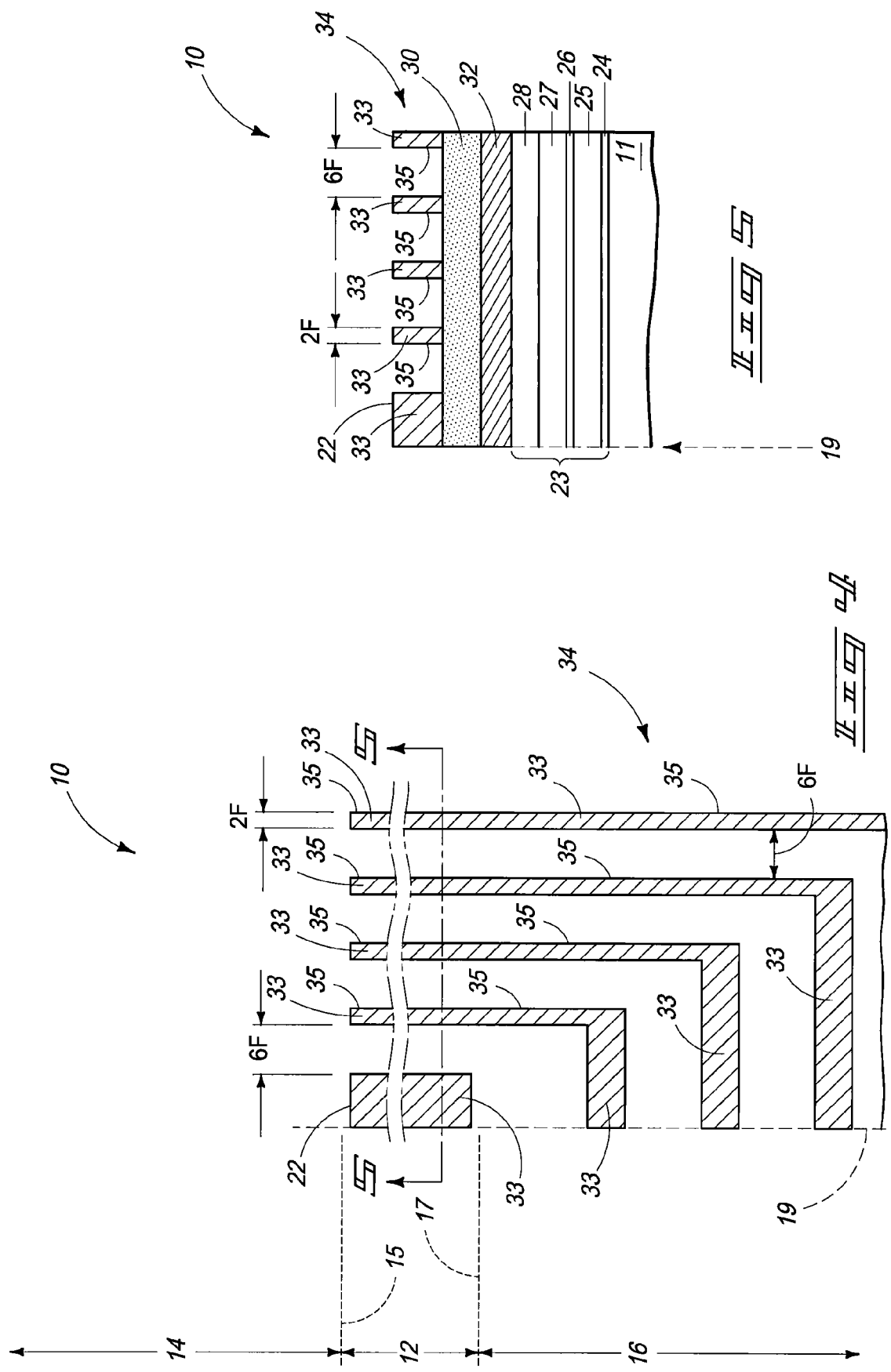

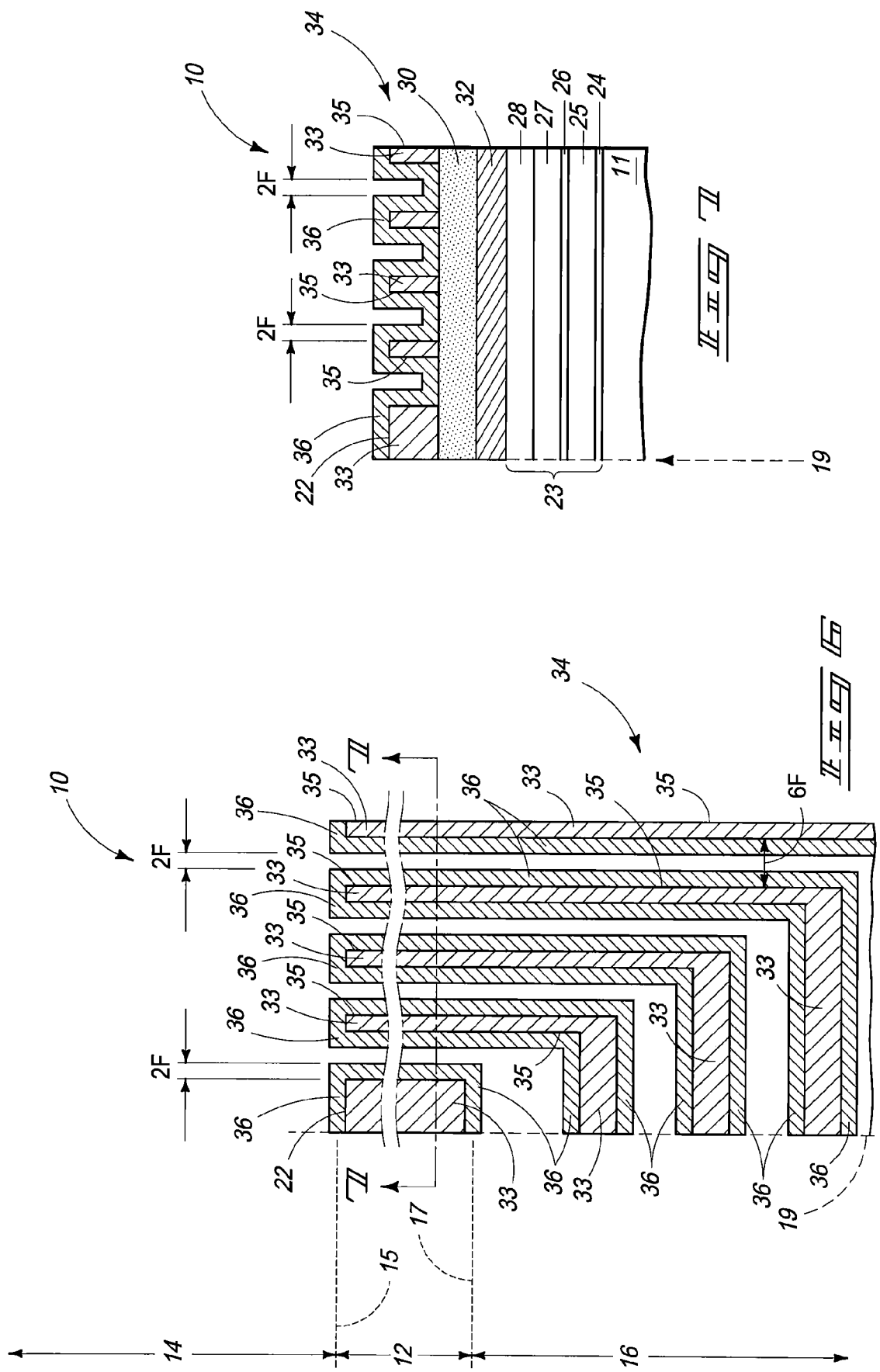

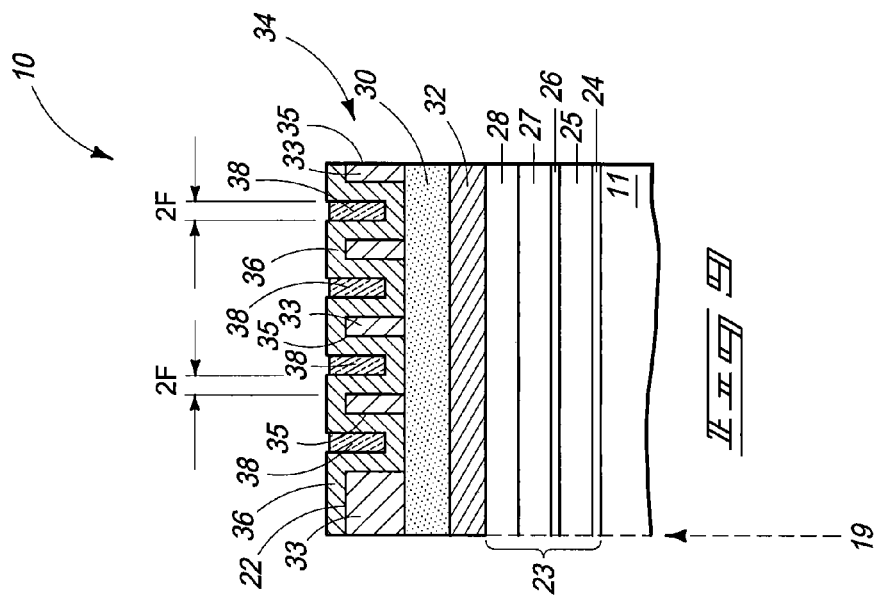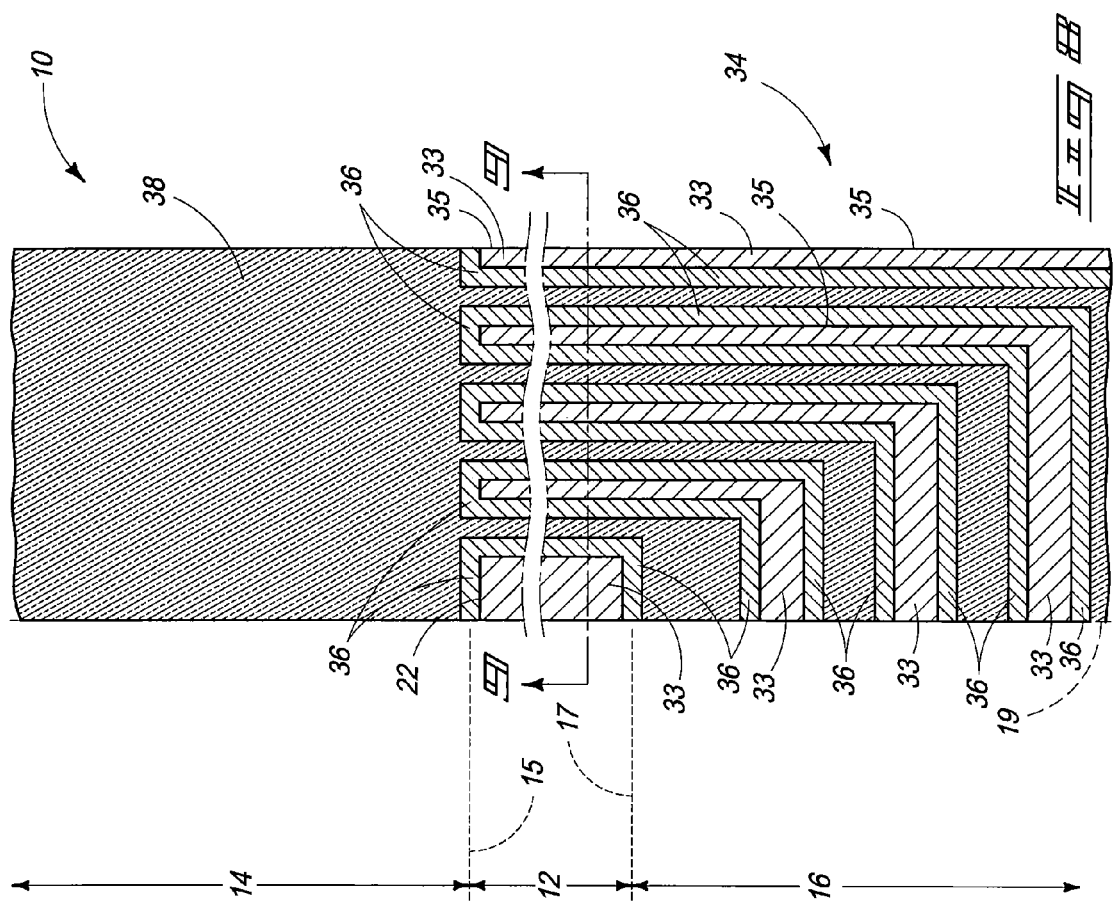

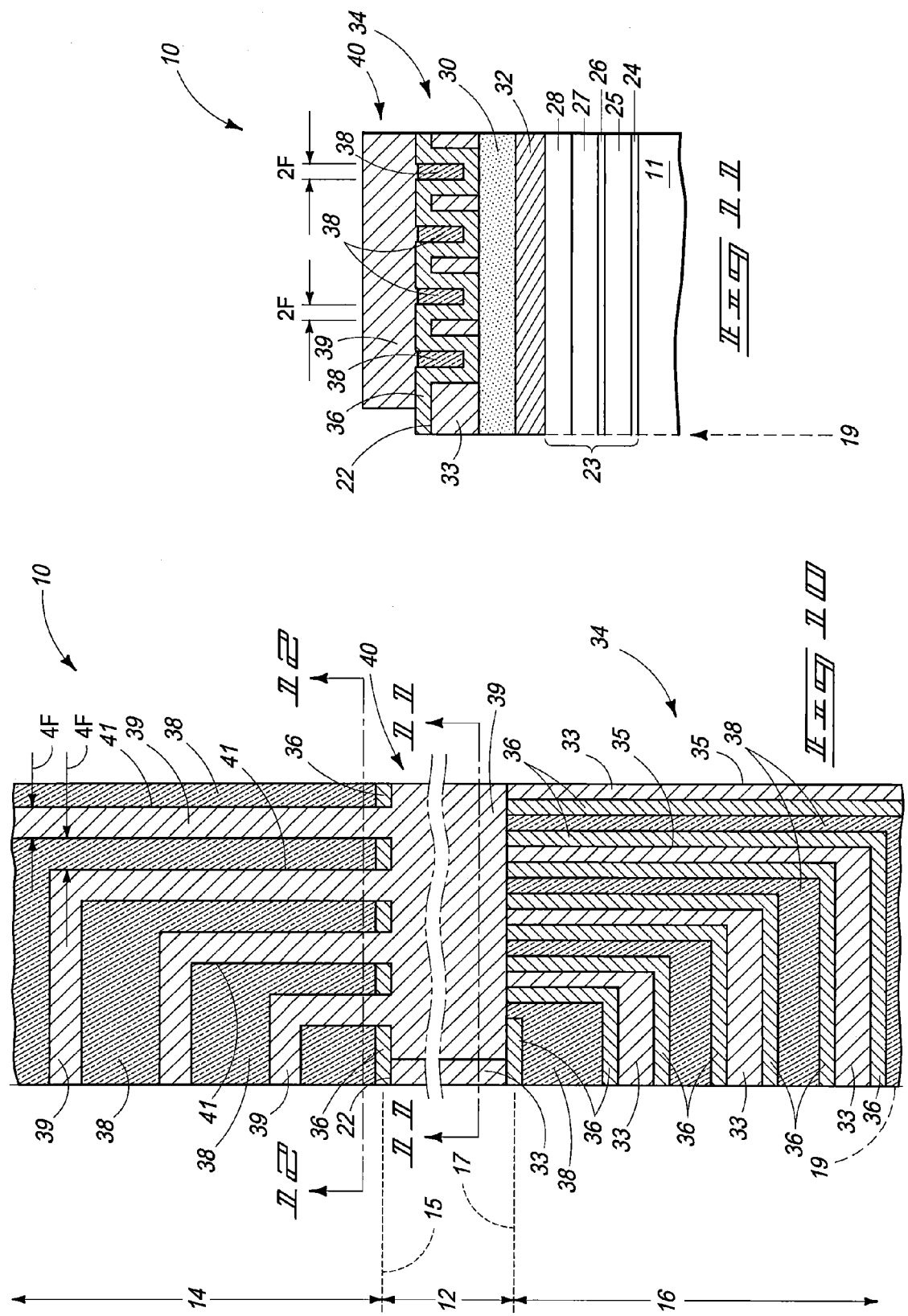

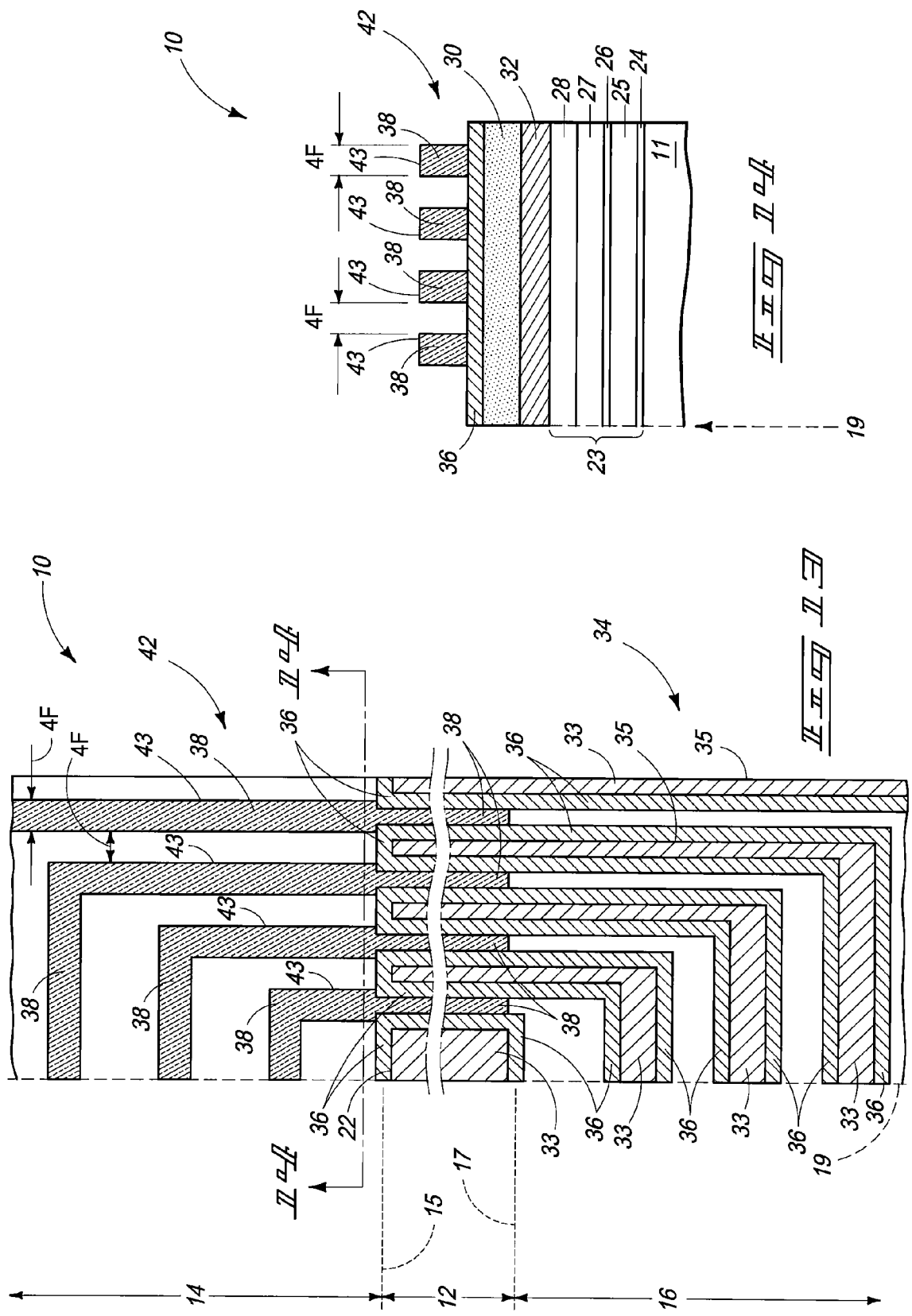

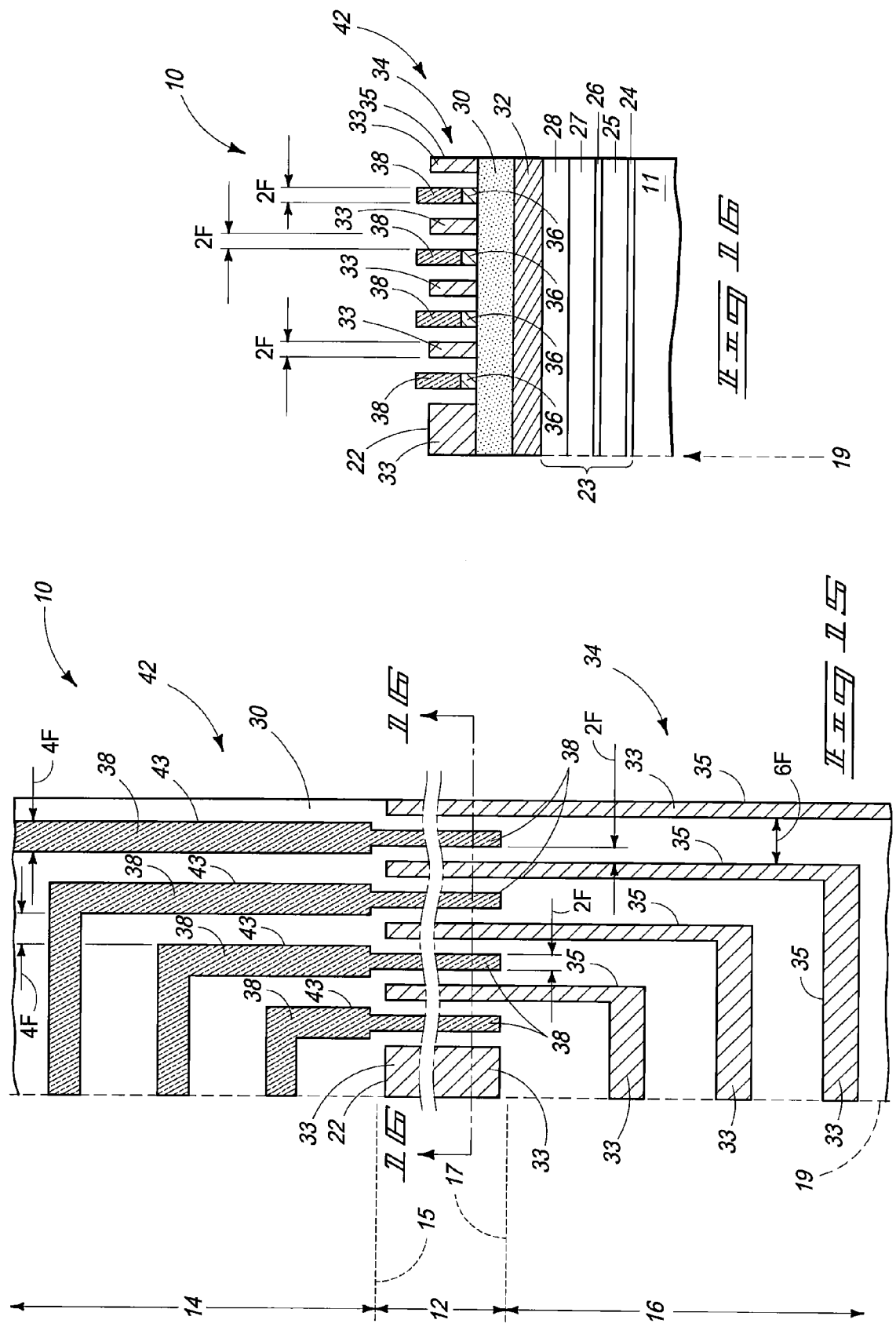

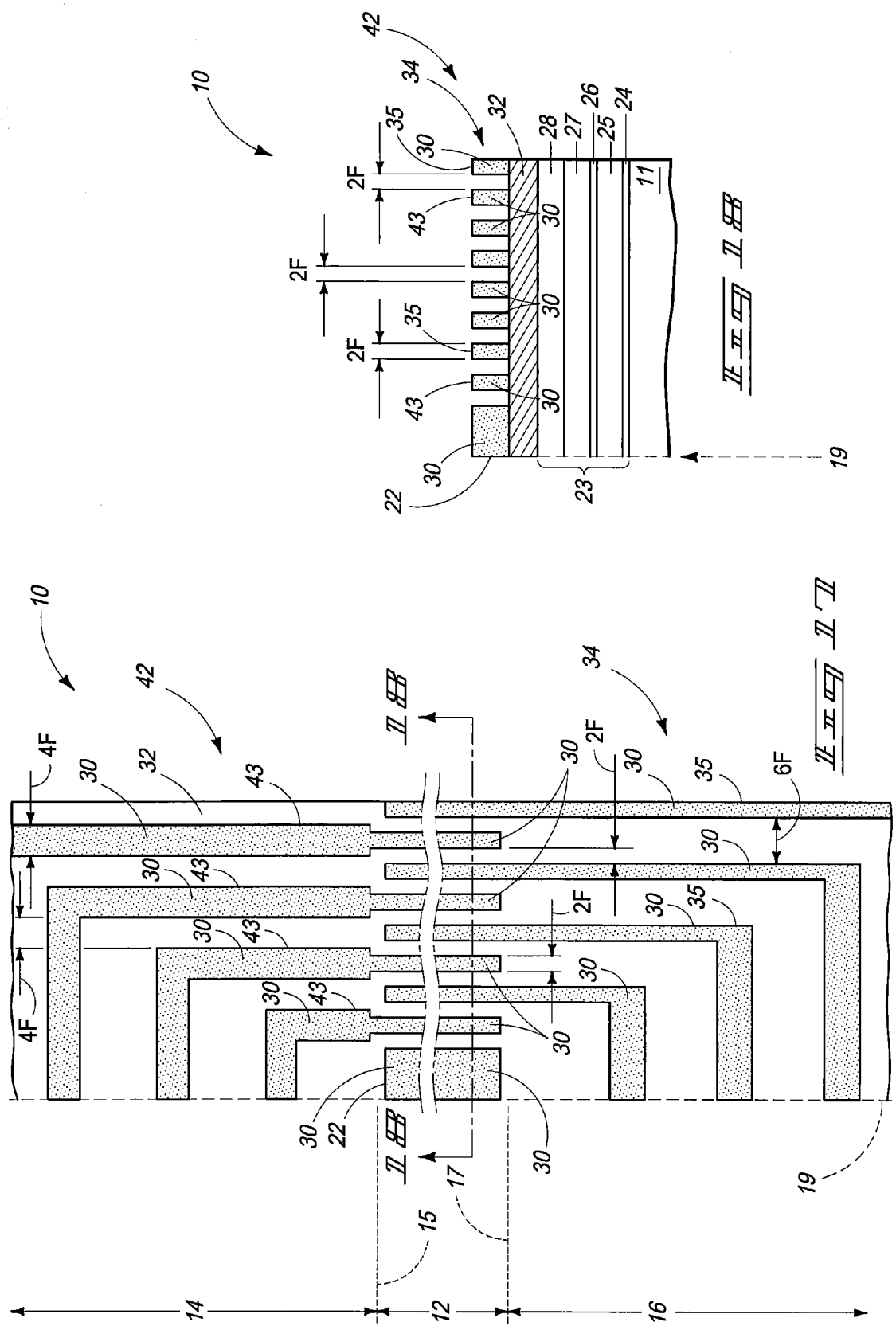

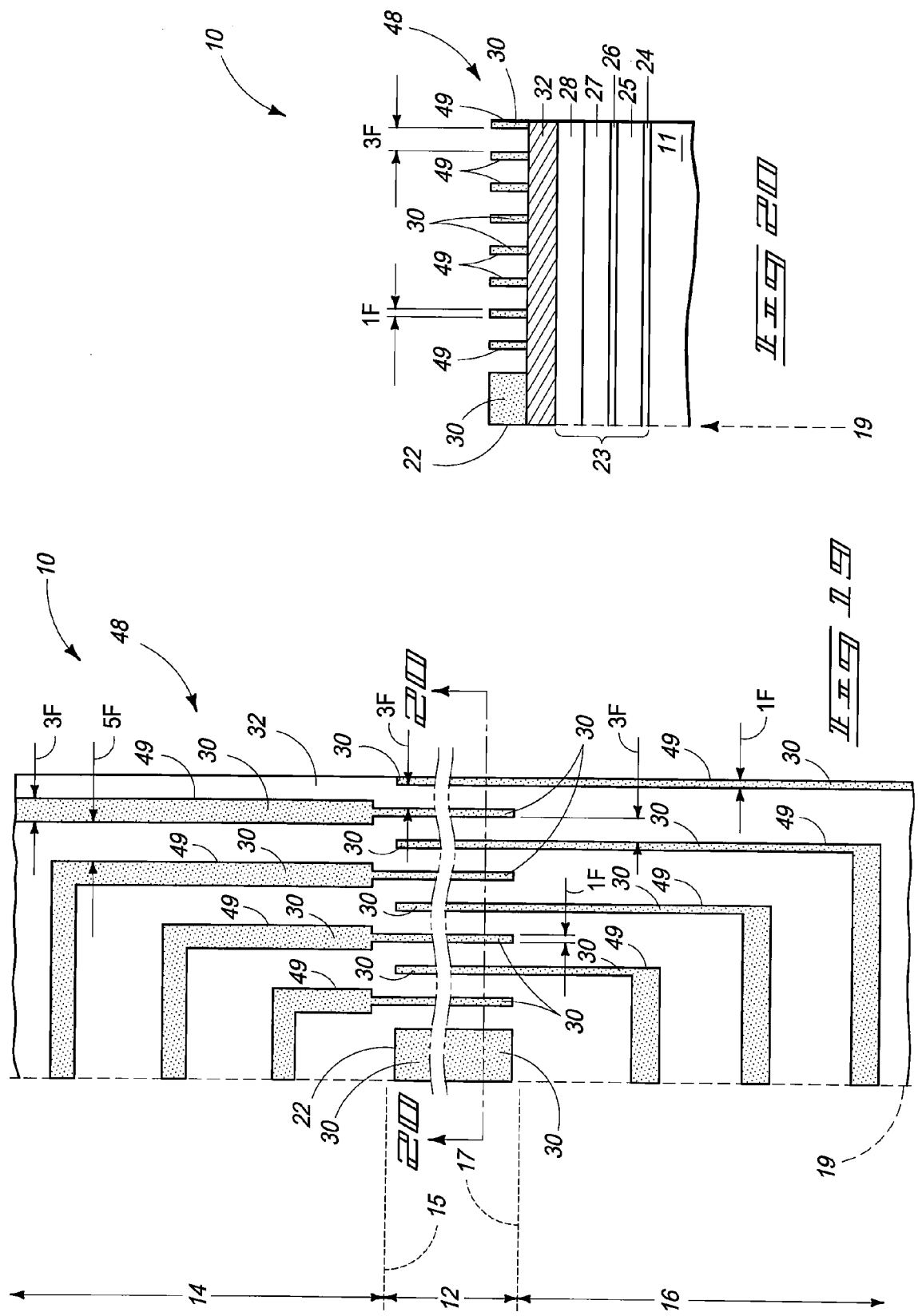

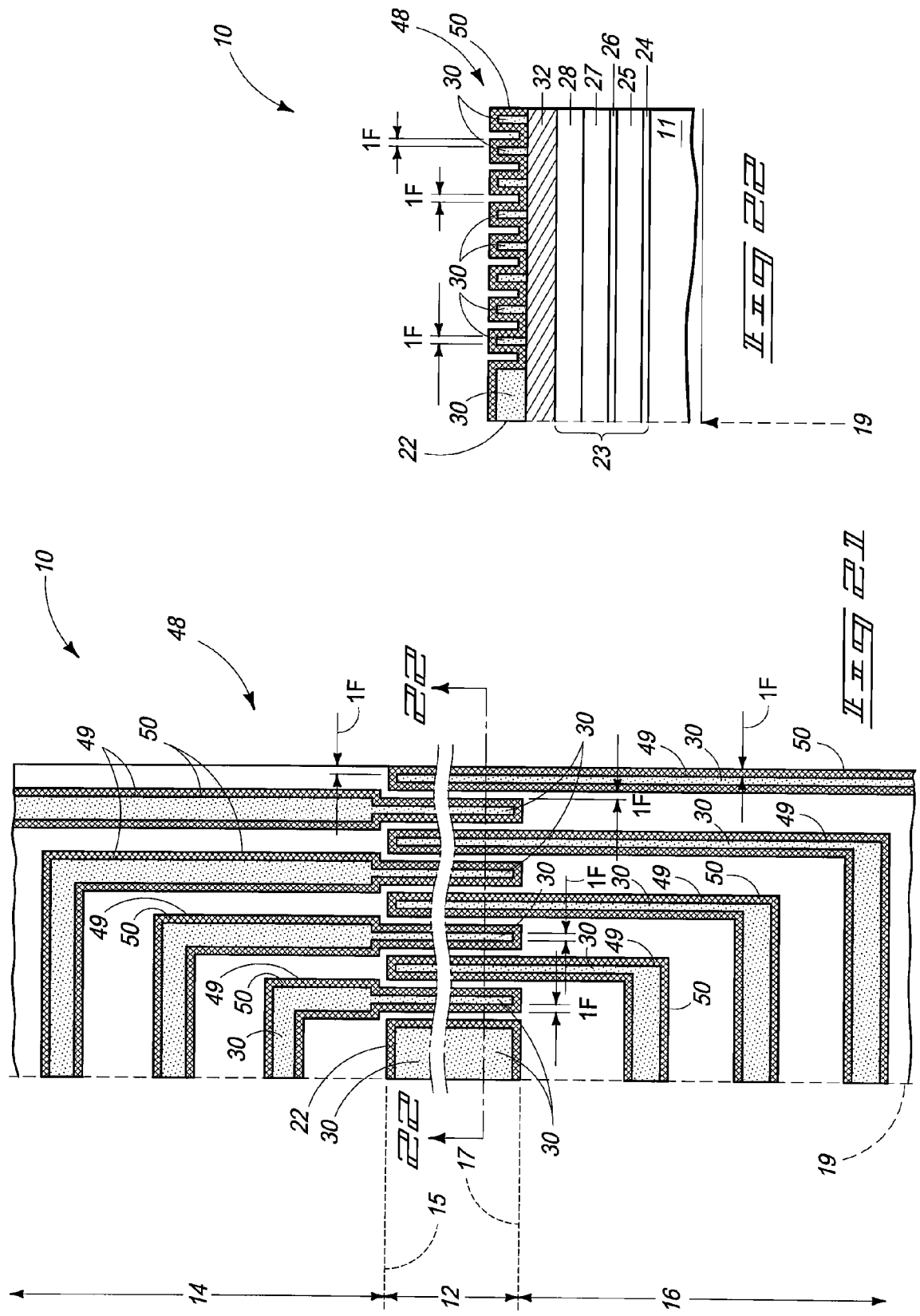

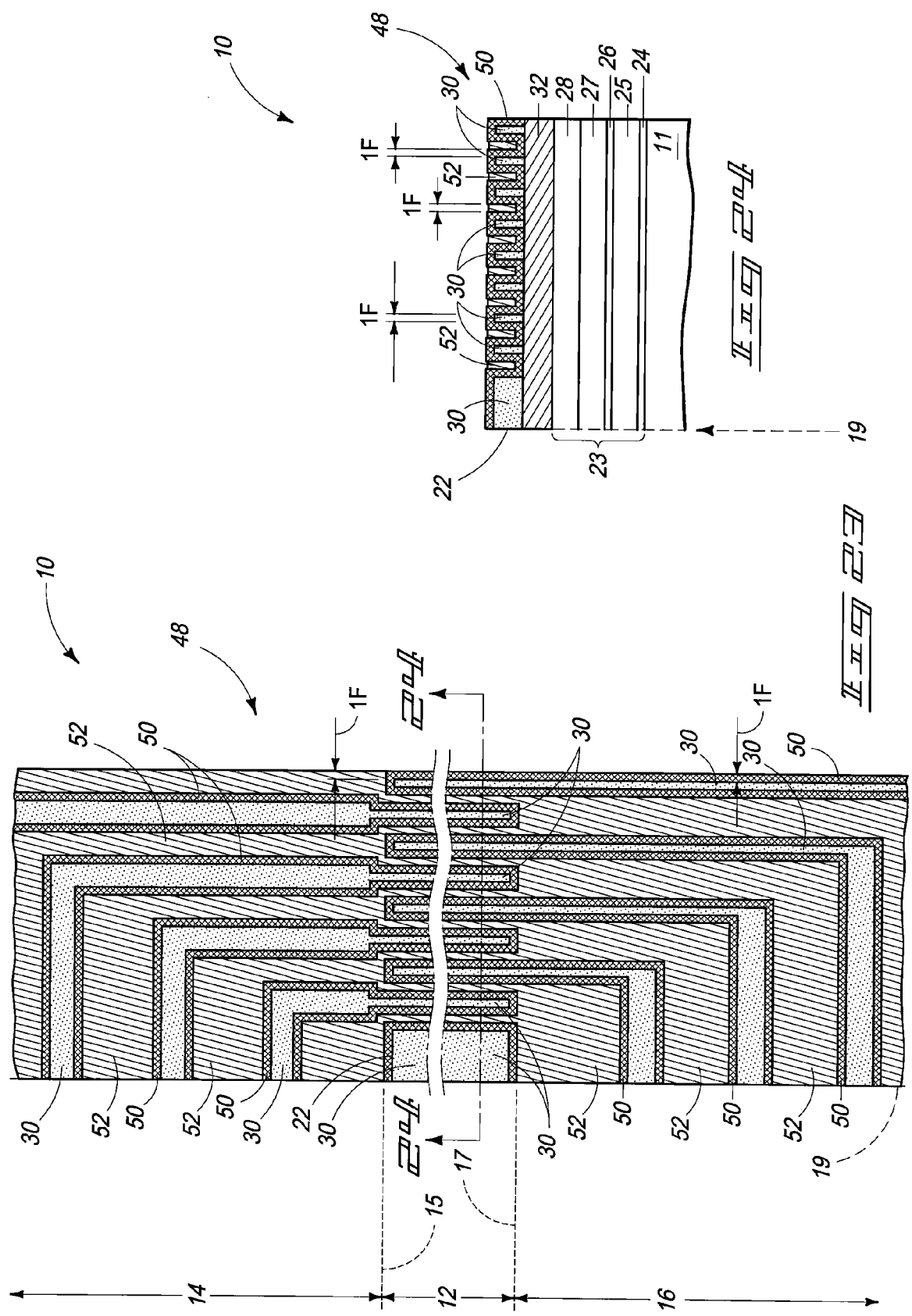

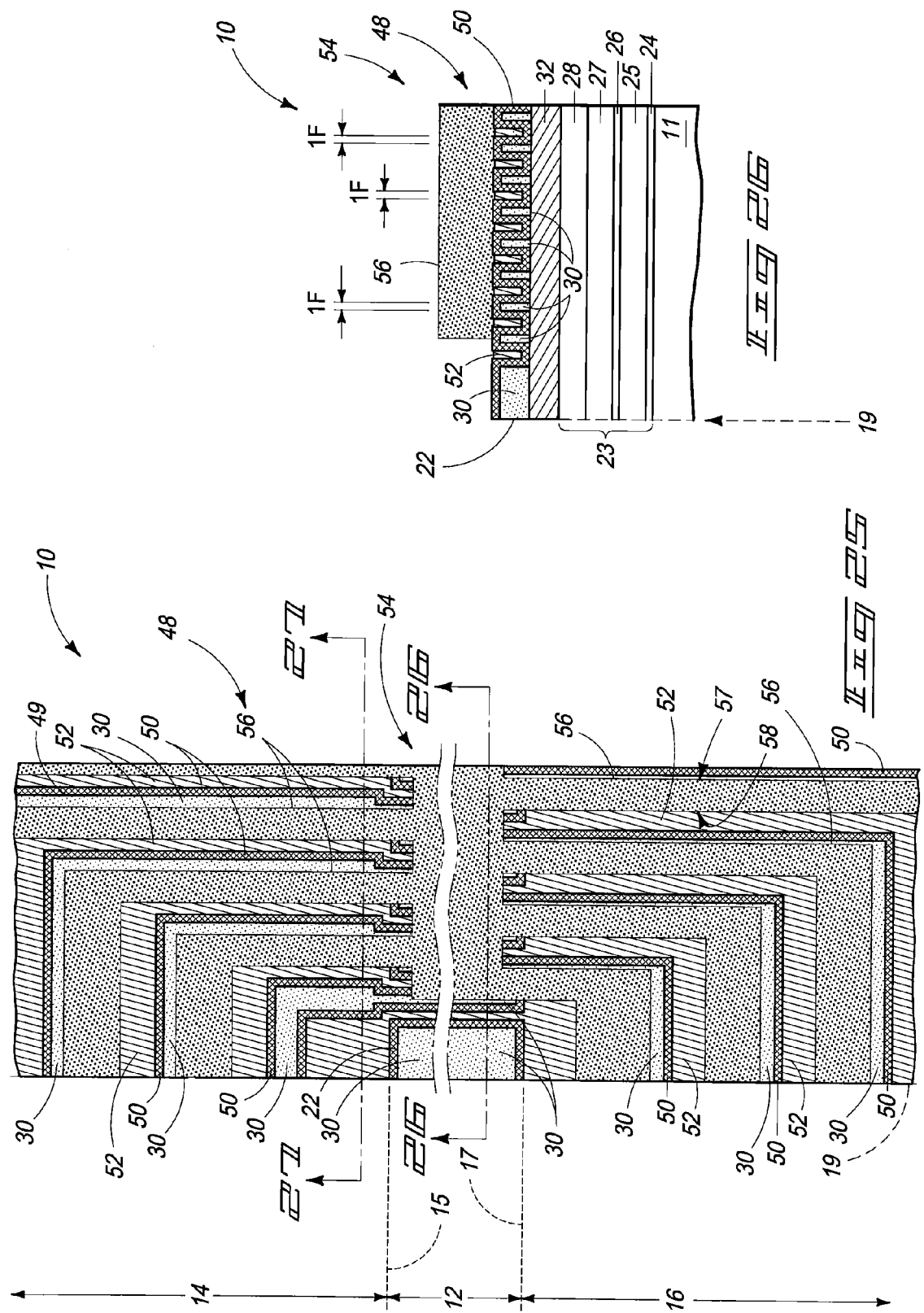

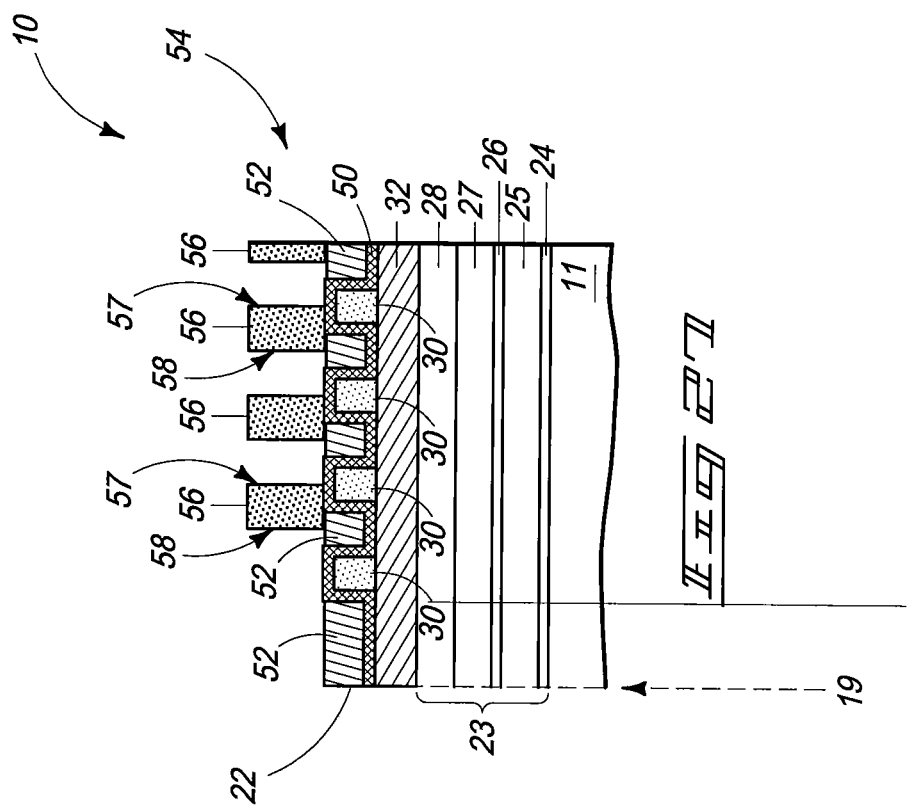

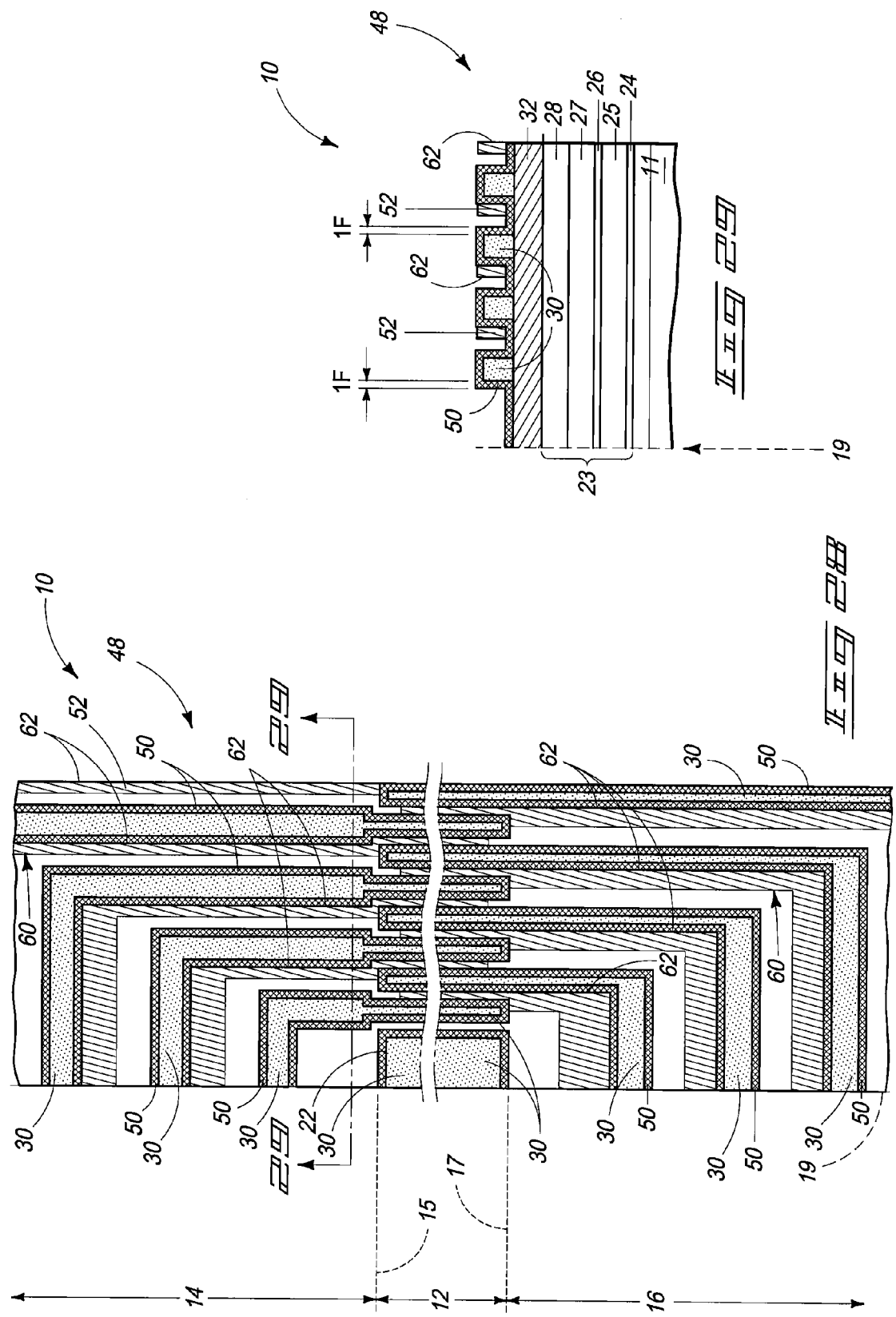

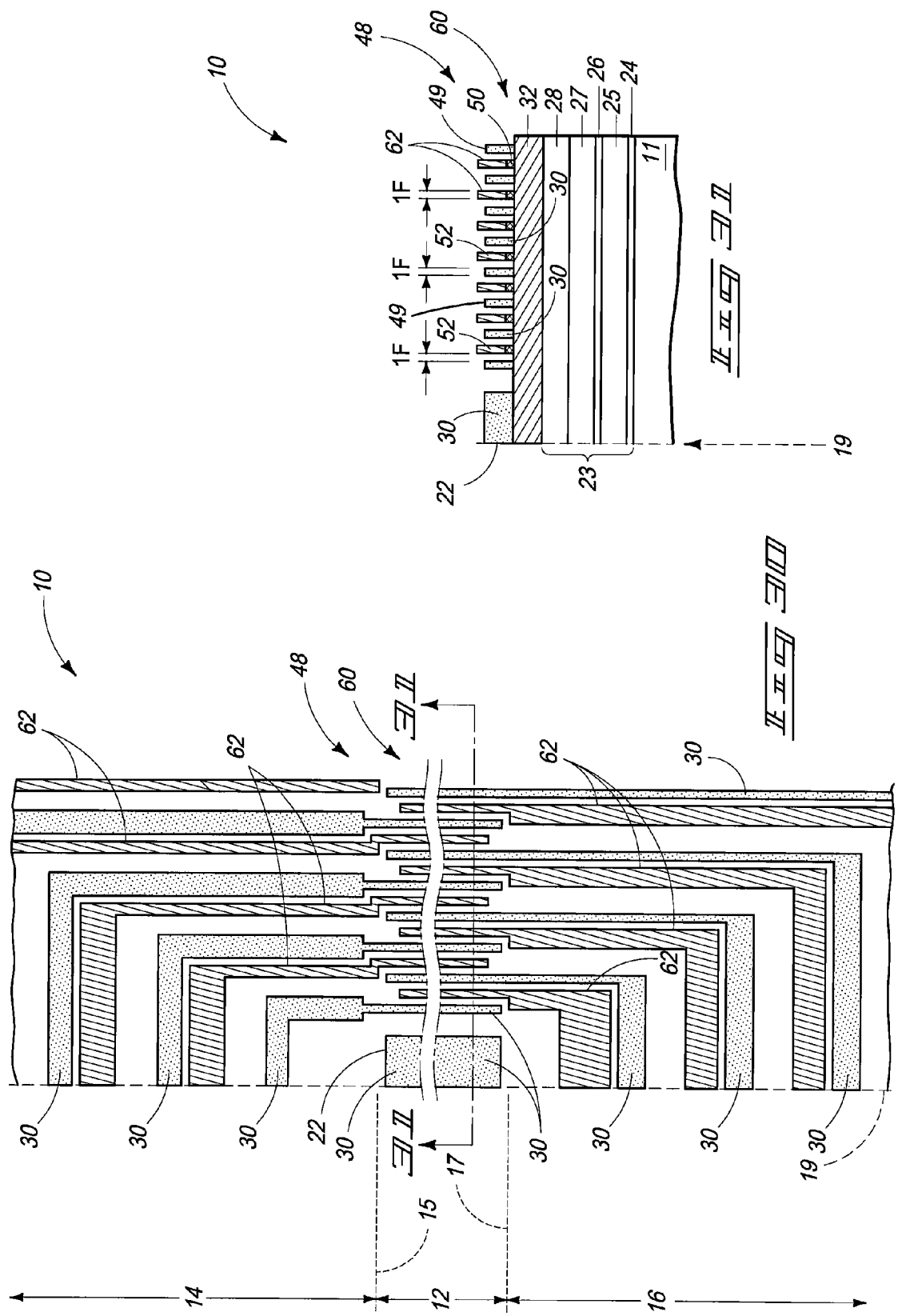

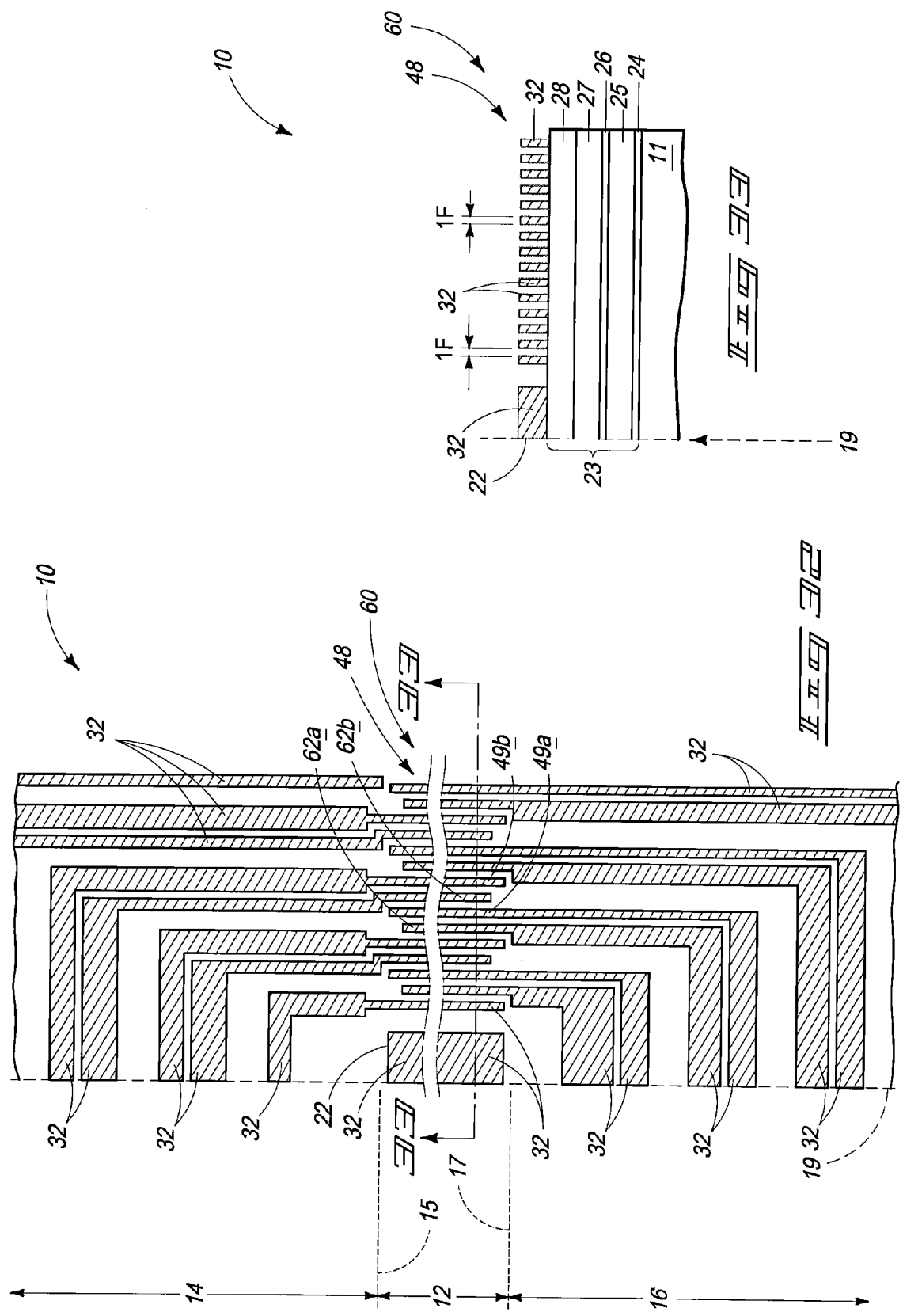

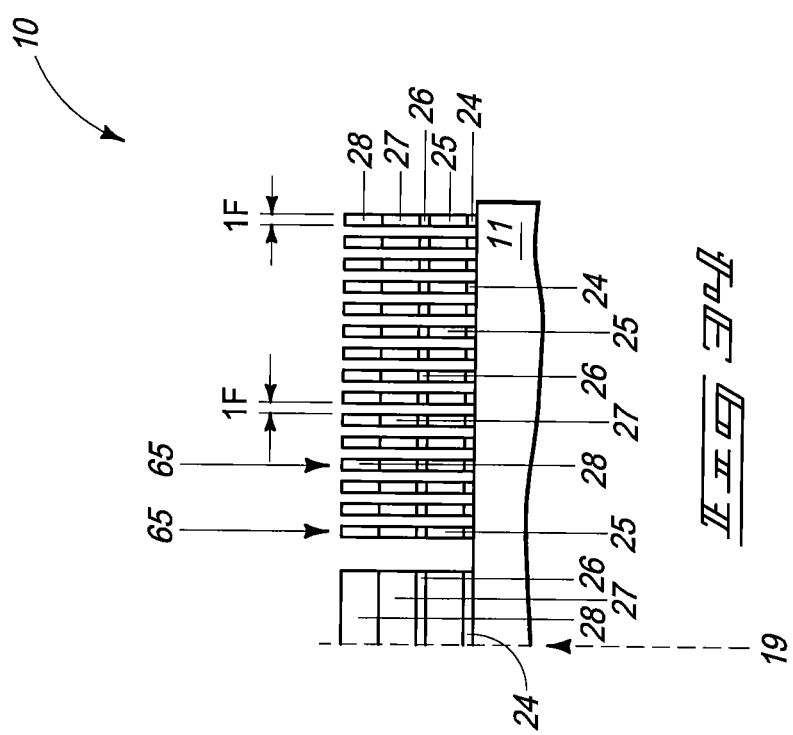

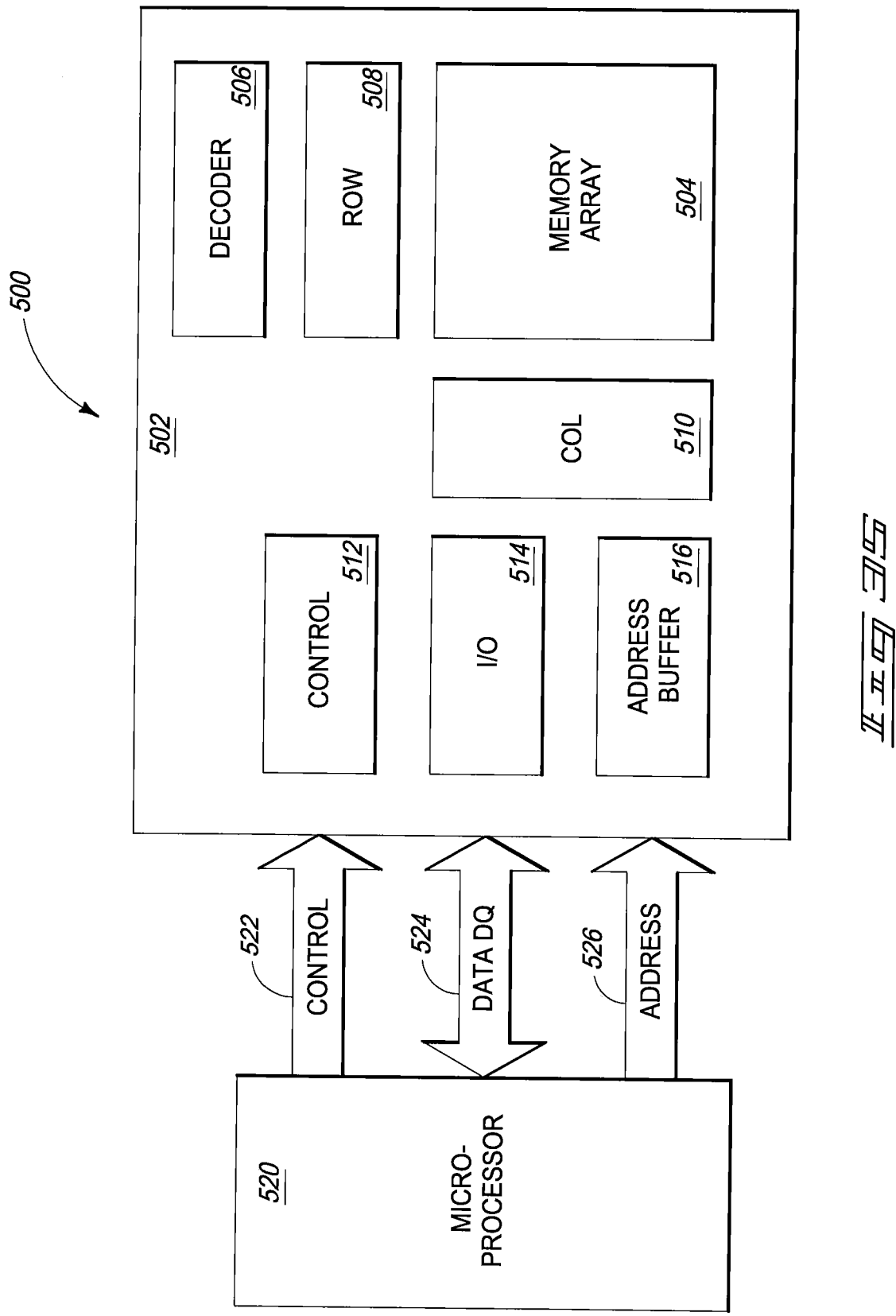

US 8,455,341 B2

METHODS OF FORMING FEATURES OF INTEGRATED CIRCUITRY

TECHNICAL FIELD

Embodiments disclosed herein pertain to methods of forming features of integrated circuitry.

BACKGROUND

Integrated circuits are often formed on a semiconductor substrate such as a silicon wafer or other semiconductive material. In general, layers of various materials which are semiconductive, conductive, or electrically insulative are utilized to form the integrated circuits. By way of examples, the various materials are doped, ion implanted, deposited, etched, grown, etc. using various processes. A continuing goal in semiconductive processing is to strive to reduce the size of individual electronic components, thereby enabling smaller and denser integrated circuitry.

One type of integrated circuitry comprises memory. Individual memory cells of such circuitry are typically densely packed within a memory array area, and have conductive lines extending outwardly there-from to connect with control circuitry outside of the memory array area. One type of layout comprises a memory array area having word lines which extend outwardly there-from to opposing first and second control circuitry connection areas on opposing sides of the memory array area. One example type of memory which may use such layout is a non-volatile memory known as flash. Flash memory is a type of EEPROM (Electrically-Erasable Programmable Read-Only Memory) that may be erased and reprogrammed in blocks. Most personal computers have BIOS stored on a flash memory chip. Further, flash continues to find increasing use in consumer devices such as MP3 players, cell phones, digital cameras, etc.

There is a continuing goal in the fabrication of memory circuitry to reduce feature sizes, such as the widths of word lines, to create smaller and denser integrated circuitry. Reduced feature sizes for integrated circuits are related to the techniques used to form those features. For example, photolithography is one technique used to pattern features (e.g., conductive word lines) of integrated circuits. A concept commonly referred to as "pitch" is used to describe the sizes of the features in conjunction with spaces immediately adjacent thereto. Pitch may be defined as the distance between an identical point in two neighboring features of a repeating pattern, thereby including the maximum width of the feature and the space to the next immediately adjacent feature. Due to factors such as optics and light or radiation wave length, photolithography techniques tend to have a minimum pitch below which a particular photolithographic technique cannot reliably form features. Thus, minimum pitch of a photolithographic technique is an obstacle to continued feature size reduction using photolithography.

Pitch multiplication is one proposed method for extending the capabilities of photolithographic techniques beyond their minimum pitch. Such forms features narrower than minimum photolithography resolution by, for example, depositing spacer-forming layers that have a lateral thickness that is less than that of the minimum capable photolithographic feature size. The spacer-forming layer is anisotropically etched to form sub-lithographic features, and then the features which were formed at the minimum photolithographic feature size may be etched from the substrate. Using such techniques where pitch is actually halved, the reduction is commonly referred to as pitch "doubling". More generally, pitch "multiplication" encompasses change in pitch by two or more times, and also of fractional values other than integers. Thus, conventionally, "multiplication" of pitch by a certain factor actually involves reduction of the pitch by that factor.

BRIEF DESCRIPTION OF THE DRAWINGS

FIG. 1 is a diagrammatic top plan view of a substrate fragment in process in accordance with an embodiment of the invention.

FIG. 2 is an enlarged diagrammatic and broken top plan view of a portion the FIG. 1 substrate.

FIG. 3 is a view of the FIG. 2 substrate taken through line 3-3 in FIG. 2.

FIG. 4 is a view of the FIG. 2 substrate at a processing step subsequent to that shown by FIG. 2.

FIG. 5 is a view of the FIG. 4 substrate taken through line 5-5 in FIG. 4.

FIG. 6 is a view of the FIG. 4 substrate at a processing step subsequent to that shown by FIG. 4.

FIG. 7 is a view of the FIG. 6 substrate taken through line 7-7 in FIG. 6.

FIG. 8 is a view of the FIG. 6 substrate at a processing step subsequent to that shown by FIG. 6.

FIG. 9 is a view of the FIG. 8 substrate taken through line 9-9 in FIG. 8.

FIG. 10 is a view of the FIG. 8 substrate at a processing step subsequent to that shown by FIG. 8.

FIG. 11 is a view of the FIG. 10 substrate taken through line 11-11 in FIG. 10.

FIG. 13 is a view of the FIG. 10 substrate at a processing step subsequent to that shown by FIG. 10.

FIG. 14 is a view of the FIG. 13 substrate taken through line 14-14 in FIG. 13.

FIG. 15 is a view of the FIG. 13 substrate at a processing step subsequent to that shown by FIG. 13.

FIG. 16 is a view of the FIG. 15 substrate taken through line 16-16 in FIG. 15.

FIG. 17 is a view of the FIG. 15 substrate at a processing step subsequent to that shown by FIG. 15.

FIG. 18 is a view of the FIG. 17 substrate taken through line 18-18 in FIG. 17.

FIG. 19 is a view of the FIG. 17 substrate at a processing step subsequent to that shown by FIG. 17.

FIG. 20 is a view of the FIG. 19 substrate taken through line 20-20 in FIG. 19.

FIG. 21 is a view of the FIG. 19 substrate at a processing step subsequent to that shown by FIG. 19.

FIG. 22 is a view of the FIG. 21 substrate taken through line 22-22 in FIG. 21.

FIG. 23 is a view of the FIG. 21 substrate at a processing step subsequent to that shown by FIG. 21.

FIG. 24 is a view of the FIG. 23 substrate taken through line 24-24 in FIG. 23.

FIG. 25 is a view of the FIG. 23 substrate at a processing step subsequent to that shown by FIG. 23.

FIG. 26 is a view of the FIG. 25 substrate taken through line 26-26 in FIG. 25.

FIG. 27 is a view of the FIG. 25 substrate taken through line 27-27 in FIG. 25.

FIG. 28 is a view of the FIG. 25 substrate at a processing step subsequent to that shown by FIG. 25.

FIG. 29 is a view of the FIG. 28 substrate taken through line 29-29 in FIG. 28.

FIG. 30 is a view of the FIG. 28 substrate at a processing step subsequent to that shown by FIG. 28.

FIG. 31 is a view of the FIG. 30 substrate taken through line 31-31 in FIG. 30.

FIG. 32 is a view of the FIG. 30 substrate at a processing step subsequent to that shown by FIG. 30.

FIG. 33 is a view of the FIG. 32 substrate taken through line 33-33 in FIG. 32.

FIG. 34 is a view of the FIG. 33 substrate at a processing step subsequent to that shown by FIG. 33.

FIG. 35 is a simplified block diagram of a memory system in accordance with an embodiment.

DETAILED DESCRIPTION OF EXAMPLE EMBODIMENTS

Figure 12:
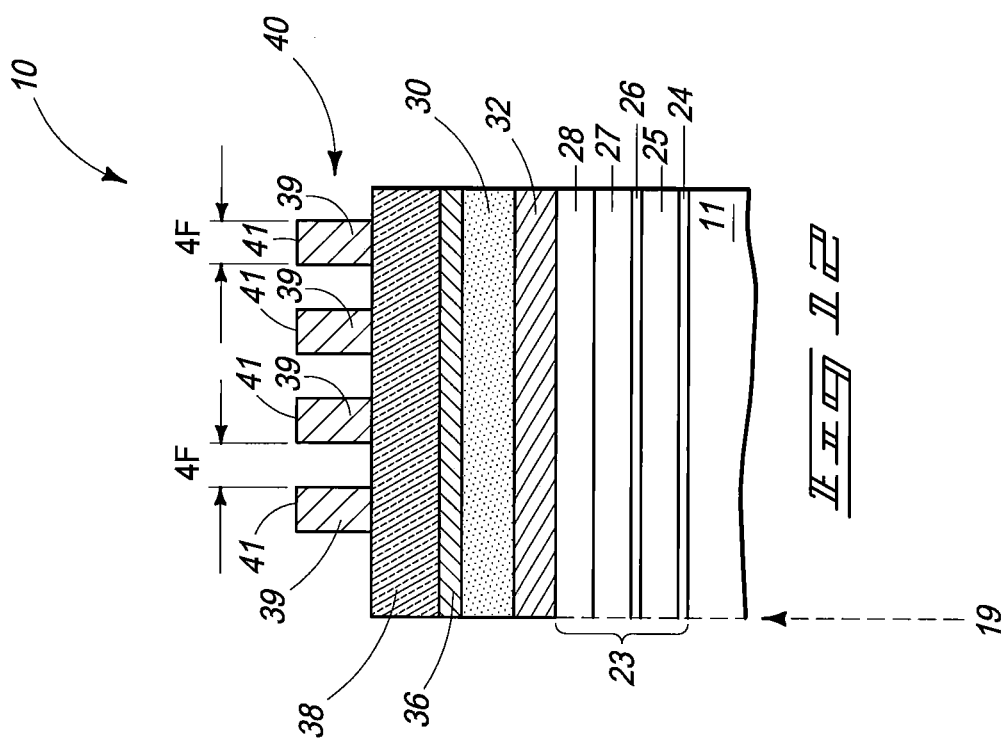
FIG. 12 is a view of the FIG. 10 substrate taken through line 12-12 in FIG. 10.

Embodiments of the invention encompass methods of forming features of integrated circuitry comprising a target area having features which extend outwardly there-from to opposing first and second periphery areas on opposing sides of the target area. For example, FIG. 1 depicts a substrate fragment 10 which may comprise a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Substrate 10 has a target area 12 and first and second periphery areas 14 and 16 on opposite sides thereof. Features (not shown) will be fabricated to extend outwardly from target area 12 into first and second periphery areas 14, 16. Further for clarity in the figures of the example embodiment, an example demarcation line 15 is shown as defining an adjoining edge of first periphery area 14 with target area 12, and an example demarcation line 17 is shown as an adjoining edge of target area 12 with second periphery area 16. Also for clarity in the figures, the depicted circuitry areas 12, 14, 16 have a far left edge 19. The top and cross sectional figures herein beyond FIG. 1 are of respective enlarged and broken fragmentary portions of the far-left edge 19 of circuitry areas 12, 14, and 16.

In one embodiment, the features to be fabricated comprise lines, as an example conductive lines formed in underlying material. In one embodiment, the integrated circuitry being fabricated comprises memory circuitry. In some embodiments, the target area comprises a memory array area, the features comprise word lines, and/or the first and second periphery areas comprise control circuitry connection areas. For example, word lines may electrically connect with conductive lines or other components of control circuitry in areas 14 and 16, and may therefore be referred to herein in some embodiments as control circuitry connection areas.

Referring to FIGS. 2 and 3, substrate 10 has been processed to comprise a first feature pattern 18. As used herein with respect to patterns and materials, use of first, second, etc. denote sequence relative to one another, and not necessarily first-ever, second-ever, etc. In one embodiment, first feature pattern 18 comprises a first word line pattern. A select gate pattern 22 has also been formed.

Example substrate 10 includes semiconductive material 11 which may comprise, consist essentially of, or consist of, for example, monocrystalline silicon lightly-doped with background p-type dopant. Material has been formed over semiconductive material 11 and in one embodiment constitutes an example word line gate stack 23. Specifically, a dielectric material 24 which will function as a tunnel dielectric has been deposited over semiconductive material 11. Such may be homogenous or non-homogenous, with silicon dioxide being an example. Charge storage material 25 has been formed over tunnel dielectric 24. Such may be homogenous or non-homogenous, with suitably conductively doped silicon being an example. As an alternate example, such might constitute metallic nanoparticles (not shown) received within a high k dielectric. Gate dielectric 26 has been deposited over charge storage material 25. Such may be homogenous or non-homogenous. As an example, such may comprise a composite of three layers of one or more different dielectric materials such as silicon dioxide, hafnium oxide, aluminum oxide, zirconium oxide, hafnium aluminum oxide, hafnium silicon oxide, etc. Conductive control gate material 27 has been deposited over gate dielectric material 26. Such also may be homogenous or non-homogenous, and may include multiple different compositions and layers. A dielectric capping layer 28 has been formed over control gate material 27.

Such provides but one example material 23. Other material may be used, and if material 23 is a word line gate stack any other existing or yet-to-be developed word line gate stack may be used. Further, if the integrated circuitry being fabricated is memory circuitry, any such word line gate stacks may or may not be non-volatile.

A first hard-mask material 30 has been formed over a second hard-mask material 32 outwardly of underlying material 23. Each may be homogenous or non-homogenous, for example comprising multiple different composition layers. Example materials for each include silicon dioxide, silicon nitride, and carbon. Each may incorporate one or more anti-reflective coatings. Example first feature pattern 18 has been formed relative to a material 33, for example photoresist or amorphous carbon. Material 33 may or may not be homogenous.

FIG. 2 depicts an example embodiment wherein first feature pattern 18 extends from target area 12 into only one of the first or second periphery areas, in this example into only second periphery area 16. Regardless, in one embodiment, first feature pattern 18 has a first pattern of lines 20 having minimum lateral width of about 4F separated by about 4F spaces, where about 1F is a minimum final feature width. Further by way of example, lines 20 are shown as right-angling to the left at staggering ends thereof for creating targeting connection points for connection with control circuitry. Such might continue in the depicted manner, proceeding from left to right, across the entirety of periphery area 16. Alternately by way of example, longitudinal left and right halves of periphery area 16 might mirror one another, wherein staggering ends of lines 20 of the left half right-angle to the left and in the right longitudinal half (not shown) right-angle to the right. Alternate configurations which may or may not have staggered and/or angled patterns may be used.

Referring to FIGS. 4 and 5, lines 20 of the first feature pattern 18 of FIGS. 2 and 3 have been laterally trimmed to form a second feature pattern 34 extending from target area 12 into only the one periphery area 16 in this example embodiment. In one embodiment, second feature pattern comprises a second word line pattern. In one embodiment, second feature pattern 34 comprises a second pattern of lines 35 having minimum lateral width of about 2F separated by about 6F spaces. Lateral trimming may be achieved, for example, by plasma etching the substrate of FIGS. 2 and 3 within an inductively coupled reactor. Chemistries and parameters may be selected by the artisan to achieve isotropic etching from top and sidewall surfaces of material 33 and/or greater lateral sidewall etching than etching from the top surfaces.

Referring to FIGS. 6 and 7, first spacer material 36 has been formed over second feature pattern 34 as well as over the other of the first and second periphery areas, in this example also over first periphery area 14. For clarity in FIG. 6, only the lateral thickness portion of material 36 is shown, although such actually blanketly covers areas 12, 14, and 16 (as is shown in FIG. 7). In one embodiment and as shown, first spacer material 36 is deposited to a thickness of about 2F. First spacer material 36 may be homogenous or non-homogenous, and regardless may be selectively etchable relative to material 33 of lines 35. In the context of this document, a selective etch requires removal of one material relative to another stated material at a rate of at least 2:1.

Referring to FIGS. 8 and 9, a first fill material 38 has been deposited over first spacer material 36 in target area 12 and in first and second periphery areas 14, 16. Such may be homogenous or non-homogenous, and may be chosen such that first spacer material 36 is selectively etchable relative to first fill material 38. First fill material 38 may be of the same or different composition as material 33. FIGS. 8 and 9 depict an example embodiment wherein first fill material 38 has been planarized back at least to an elevationally outermost surface of first spacer material 36. Alternately by way of example, little or no planarization might occur whereby first fill material 38 covers some or all of the elevationally outermost surfaces of first spacer material 36.

Referring to FIGS. 10-12, a mask 40 has been formed as part of substrate 10, and comprises any suitable material 39. In one embodiment, mask 40 is formed to cover most, if not all, of target area 12, leave most, if not all, of second periphery area 16 exposed, and form lines 41 in first periphery area 14. In one embodiment, lines 41 are complimentary in size and shape to lines 20 of first feature pattern 18, for example having minimum lateral width of about 4F separated by about 4F spaces.

Referring to FIGS. 13 and 14, mask 40 (not shown) has been used as an etch mask in forming a third feature pattern 42 with first fill material 38, and then mask 40 has been removed. In one embodiment, third feature pattern comprises a third word line pattern. Third feature pattern 42 comprises first fill material 38 received over first spacer material 36. As in FIG. 6, for clarity, only the lateral thickness portion of material 36 is shown, although such actually blanketly covers areas 12, 14, and 16 (as is shown in FIG. 14). In one embodiment, third feature pattern 42 extends from target area 12 into only the other first or second periphery area, with such being first periphery area 14 in the depicted embodiment. Third feature pattern 42 comprises a third pattern of lines 43 which self-align and alternate with lines 35 of second pattern of lines 34 in target area 12, and have lateral width of about 2F within target area 12. Lines 43 have minimum lateral width of about 4F separated by about 4F spaces within first periphery area 14.

Referring to FIGS. 15 and 16, elevationally exposed first spacer material 36 (not shown) has been removed from target area 12 and second periphery area 16, and also from first periphery area 14. First spacer material 36 may remain beneath first material 38 as part of third feature pattern 42.

Referring to FIGS. 17 and 18, second and third feature patterns 34, 42 have been transferred by etching to first hard-mask material 30, with materials 33, 36, and 38 (not shown) being removed during such process or subsequently.

Referring to FIGS. 19 and 20, second and third pattern of lines 34, 42 (not shown) in first hard-mask material 30 have been laterally trimmed to form a fourth feature pattern 48. In one embodiment, fourth feature pattern comprises a fourth word line pattern. In one embodiment, fourth feature pattern 48 comprises a fourth pattern of lines 49 having minimum lateral width of about 1F separated by about 3F spaces within target area 12.

Referring to FIGS. 21 and 22, second spacer material 50 has been formed over fourth feature pattern 48 in target area 12 and in first and second periphery areas 14, 16. Such may be of the same composition as first spacer material 36 described above, and regardless may be chosen such that it is selectively etchable relative to first hard-mask material 30 and to a subsequently deposited material 52 (not shown in FIGS. 21 and 22, and described below). In one embodiment, second spacer material 50 is deposited to a thickness of about 1F. For clarity in FIG. 21, as was analogously done in FIG. 6, only the lateral thickness portion of material 50 is shown, although such actually blanketly covers areas 12, 14, and 16 (as is shown in FIG. 22).

Referring to FIGS. 23 and 24, second fill material 52 has been deposited over second spacer material 50 in target area 12 and in first and second periphery areas 14, 16. Second fill material 52 may be of the same composition as first fill material 38, and regardless may be chosen such that second spacer material 50 is selectively etchable relative to second fill material 52. FIGS. 23 and 24 depict second fill material 52 as having been planarized back at least to the elevationally outermost surfaces of second spacer material 50. Alternately, little or no planarization might occur whereby second fill material 52 covers some or all of the elevationally outermost surfaces of second spacer material 50.

Referring to FIGS. 25-27, an etch mask 54 has been formed as part of substrate 10. Such is depicted as covering most of target area 12, and comprises individual mask lines 56 extending into first and second control circuitry areas 14, 16. In one embodiment, individual mask lines 56 have opposing longitudinal edges 57, 58 within first and second control circuitry areas 14, 16. In one embodiment, one of such edges (57) overlies individual lines 49 of feature pattern 48 in periphery areas 14, 16. In one embodiment, the other longitudinal edge (58) overlies second fill material 52 received between spacer material 50 that is between immediately adjacent lines 49 in periphery areas 14, 16.

Referring to FIGS. 28 and 29, a fifth feature pattern 60 has been formed with second fill material 52. Such comprises second fill material 52 received over second spacer material 50. In one embodiment, fifth feature pattern comprises a fifth word line pattern. Fifth feature pattern 60 extends from array area 12 into first and second periphery areas 14, 16. Fifth feature pattern 60 comprises a fifth pattern of lines 62 which self-align and alternate with fourth pattern of lines 48 of first hard-mask material 30 in target area 12, and have lateral width of about 1F in target area 12.

Referring to FIGS. 30 and 31, elevationally exposed second spacer material 50 (not shown) has been removed from target area 12 and first and second periphery areas 14, 16.

Referring to FIGS. 32 and 33, fourth and fifth feature patterns 48, 60 have been transferred by etching to second hard-mask material 32.

Referring to FIG. 34, fourth and fifth feature patterns 48, 60 in second hard-mask material 32 (not shown) have been transferred by etching to underlying material 23 to form features 65 within target area 12 having minimum lateral width of about 1F. Then, hard-mask material 32 (not shown) is removed.

An embodiment of the invention includes forming an initial pitch multiplied feature pattern extending from the target area into only one of the first or second periphery areas. In the context of this document, "initial" in describing and claiming certain embodiments is only used in conjunction with formation of some "subsequent" pattern, and accordingly only requires formation in sequence prior to the recited formation of a subsequent pattern. Use of "initial" in this document does not imply nor require formation of a first-ever stated such pattern. In one embodiment, the initial pitch multiplied feature pattern comprises a word line pattern.

In the context of this embodiment, feature pattern 34 of FIG. 4 is but one example such initial pitch multiplied feature pattern which extends from a target area 12 into only one of first or second periphery areas 14, 16. In one embodiment, formation of such an initial pitch multiplied feature pattern comprises lateral trimming of masking material from which the initial pitch multiplied word pattern is made.

After forming the initial pitch multiplied feature pattern, a subsequent feature pattern is formed which extends from the target area into the other of the first or second periphery areas. By way of examples only, FIGS. 15 and 16 depict such a subsequent feature pattern 42 extending from target area 12 into first periphery area 14. Such subsequent feature pattern may or may not be formed to be effectively pitch multiplied within the target area, with pitch multiplication being shown in the embodiment of FIG. 15. Further, the subsequent feature pattern may or may not be formed to self-align relative to the initial pitch multiplied feature pattern in the target area, with such self-aligning being shown in the processing occurring in the formation of such subsequent feature pattern in going from FIGS. 8 through 15. In one embodiment, the subsequent feature pattern is formed to self-align between spacer material deposited laterally over sidewalls of the initial pitch multiplied feature pattern. In one embodiment, the subsequent feature pattern comprises a subsequent word line pattern.

Regardless, the initial and subsequent feature patterns are used in forming features in underlying material in one embodiment, with such features extending from the target area to the first and second periphery areas. Such may or may not comprise subsequent pitch multiplication of the initial and subsequent feature patterns. The processing in going from FIG. 17 to FIG. 34 depicts such example processing wherein subsequent pitch multiplication occurs.

In one embodiment, the initial and subsequent feature patterns are transferred to a first hard-mask. Such transferred patterns are pitch multiplied, and subsequently transferred to a second hard-mask. Subsequently, the second hard-mask is used as an etch mask in forming features in underlying material by etching.

In one embodiment, the pitch multiplication of the initial pitch multiplied feature pattern is from about 4F to about 2F, where 1F is a minimum final feature width. In one embodiment, the subsequent feature pattern is formed to be effectively pitch multiplied to about 2F within the target area.

In one embodiment, an initial feature pattern is formed in a first hard-mask. The initial feature pattern comprises an initial pattern of lines which alternate every other line in extending from the target area to alternating of the first and second periphery areas. In one embodiment, the initial feature pattern comprises an initial word line pattern. The embodiment of FIGS. 17 and 18 depicts, by way of example only, such an example embodiment. The initial feature pattern is used in forming a subsequent feature pattern in a second hard-mask.

The subsequent feature pattern comprises a subsequent pattern of lines which alternate in pairs of two immediately adjacent lines in extending from the target area to alternating of the first and second periphery areas. In one embodiment, the subsequent feature pattern comprises a subsequent word line pattern. Regardless, the processing in going from FIGS. 19-31 is such processing by way of example. For example, referring to FIG. 30, a combination of feature patterns 48 and 60 constitute an example such subsequent feature pattern. Further, FIG. 32 shows a subsequent pattern of lines 62a, 62b, 49a, 49b which alternate in pairs of two immediately adjacent lines (a pair 62a, 49a and an immediately adjacent pair 62b, 49b) in extending from target area 12 to alternating of first and second periphery areas 14, 16. Such subsequent feature pattern in second hard-mask 32 may be transferred to a material 23 in target area 12 and first and second periphery areas 14, 16.

In one embodiment, the forming of the initial feature pattern uses pitch multiplication. In one embodiment, an initial feature pattern in a first hard-mask is used in forming a subsequent feature pattern in a second hard-mask using pitch multiplication. In one embodiment where pitch multiplication is used in both, the initial pitch multiplication may be from about 4F to about 2F and the subsequent pitch multiplication may be from about 2F to about 1F, where F is a minimum final feature width.

In one embodiment and as shown in FIG. 32 by way of example, the two immediately adjacent lines within individual of the pairs may be formed to comprise different minimum widths outside of target area 12. In one embodiment and as shown in FIG. 32, the two immediately adjacent lines within individual of the pairs may be formed to be equally spaced from one another along their respective lengths outside of target area 12.

In one embodiment and as shown in FIG. 32, two immediately adjacent lines within individual of the pairs may be formed to be equally spaced from one another at a first spacing along their respective lengths outside of the target area. Immediately adjacent of such pairs may be formed to be equally spaced from one another at a second spacing along their respective lengths outside of the target area, with the second spacing being greater than the first spacing. For example with respect to FIG. 32, the pairs of adjacent lines are further apart from immediately adjacent pairs than are the lines within each individual pair.

In another embodiment of the invention, three, and only three, photomasking steps are used in defining longitudinal outlines of pitch quadrupled features in a hard-mask received within the target area and which individually extend to individual of the opposing first and second periphery areas. In such embodiment, the longitudinal outlines of the pitch quadrupled features are transferred in the hard-mask to underlying material overlying the target area and the first and second periphery areas. In one embodiment and as described and shown above, a first of the three photomasking steps is used to form an initial feature pattern extending from the target area into only one of the first or second periphery areas, for example in the processing of FIGS. 2 and 3. In one embodiment, an intermediate of the three photomasking steps is used to form an intermediate feature pattern extending from the target area into only one of the first or second periphery areas, for example in the processing of FIGS. 10-13. In one embodiment, a third of the three photomasking steps is used to form a tertiary feature pattern extending from the target area into the first and second periphery areas, for example as shown in the processing of FIGS. 25-27.

Features fabricated in accordance with any of the above embodiments may be used in any existing or yet-to-be-developed integrated circuitry, for example in memory circuitry with flash memory being but one example. A typical flash memory comprises a memory array that includes a large number of memory cells arranged in row and column fashion. The cells are usually grouped into blocks. Each of the cells within a block may be electrically programmed by charging an individual charge storage structure. The charge may be removed from the charge storage structure by a block erase operation. Data is stored in a cell as charge in the charge storage structure.

NAND is a basic architecture of existing flash memory. A NAND architecture comprises at least one select gate coupled in series to a serial combination of memory cells.

FIG. 35 is a simplified block diagram of a memory system 500. The memory system includes an integrated circuit flash memory device 502 (e.g., a NAND memory device), that includes an array of memory cells 504, an address decoder 506, row access circuitry 508, column access circuitry 510, control circuitry 512, input/output (I/O) circuitry 514, and an address buffer 516. Memory system 500 also includes an external microprocessor 520, or other memory controller, electrically connected to memory device 502 for memory accessing as part of an electronic system. The memory device 502 receives control signals from the processor 520 over a control link 522. The memory cells are used to store data that is accessed via a data (DQ) link 524. Address signals are received via an address link 526, and are decoded at address decoder 506 to access the memory array 504. Address buffer circuit 516 latches the address signals. The memory cells may be accessed in response to the control signals and the address signals.

Figure 36:
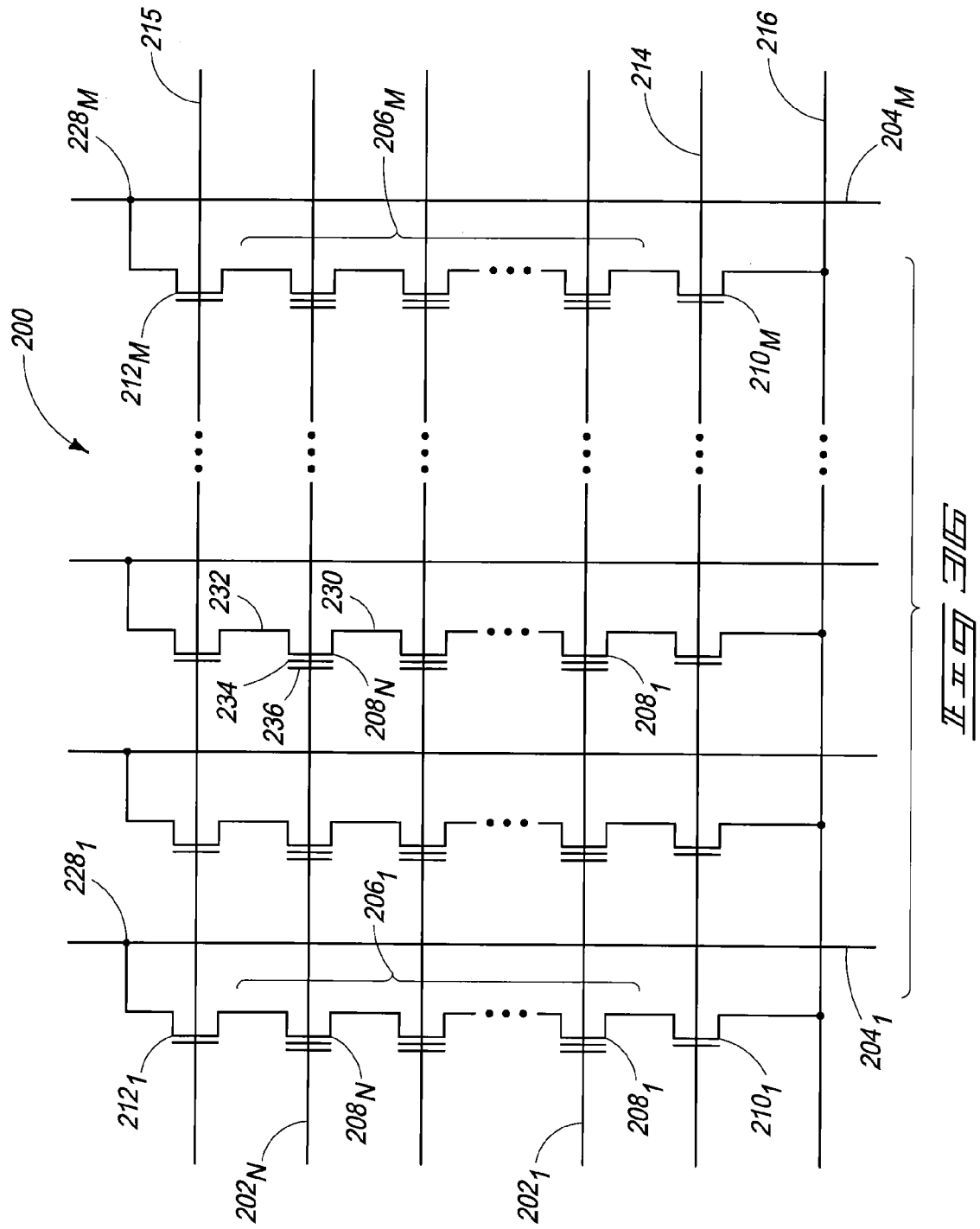
FIG. 36 is a schematic of a non-volatile memory array in accordance with an embodiment.

FIG. 36 is a schematic of a NAND memory array 200. Such may be a portion of memory array 504 of FIG. 8. Memory array 200 includes word lines $202_1$ to $202_N$, and intersecting local bit lines $204_1$ to $204_M$. The number of word lines 202 and the number of bit lines 204 may be each some power of two, for example, 256 word lines and 4,096 bit lines. The local bit lines 204 may be coupled to global bit lines (not shown) in a many-to-one relationship.

Memory array 200 includes NAND strings $206_1$ to $206_M$. Each NAND string includes charge-storage transistors $208_1$ to $208_N$. The charge-storage transistors may use, for example, floating gate material to store charge, or may use charge-trapping material (such as, for example, metallic nanodots) to store charge.

The charge-storage transistors 208 represent non-volatile memory cells for storage of data. The charge-storage transistors 208 of each NAND string 206 are connected in series source to drain between a source select gate 210 and a drain select gate 212. Each source select gate 210 is located at an intersection of a local bit line 204 and a source select line 214, while each drain select gate 212 is located at an intersection of a local bit line 204 and a drain select line 215.

A source of each source select gate 210 is connected to a common source line 216. The drain of each source select gate 210 is connected to the source of the first charge-storage transistor 208 of the corresponding NAND string 206. For example, the drain of source select gate $210_1$ is connected to the source of charge-storage transistor $208_1$ of the corresponding NAND string $206_1$. The source select gates 210 are connected to source select line 214.

The drain of each drain select gate 212 is connected to a local bit line 204 for the corresponding NAND string at a drain contact 228. For example, the drain of drain select gate $212_1$ is connected to the local bit line $204_1$ for the corresponding NAND string $206_1$ at drain contact $228_1$. The source of each drain select gate 212 is connected to the drain of the last charge-storage transistor 208 of the corresponding NAND string 206. For example, the source of drain select gate $212_1$ is connected to the drain of charge-storage transistor $208_N$ of the corresponding NAND string 206

Charge-storage transistors 208 include a source 230, a drain 232, a charge storage structure 234, and a control gate 236. Charge-storage transistors 208 have their control gates 236 coupled to, and in some cases form, a word line 202. A column of the charge-storage transistors 208 are those transistors within a NAND string 206 configured to be coupled to a given local bit line 204. A row of the charge-storage transistors 208 are those transistors commonly coupled to a given word line 202.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming features of integrated circuitry, comprising:
   forming an initial pitch multiplied feature pattern extending from a target area into only one of a first or second periphery area received on opposing sides of the target area;
   after forming the initial pitch multiplied feature pattern, forming a subsequent feature pattern extending from the target area into the other of the first or second periphery area; and
   using the initial and subsequent feature patterns in forming features in underlying material which extend from the target area to the first and second periphery areas.

2. The method of claim 1 wherein the initial pitch multiplied feature pattern comprises a word line pattern, the target area comprises a memory array area, the first and second periphery areas are control circuitry connection areas, the subsequent feature pattern comprises a subsequent word line pattern, and the underlying material comprises a gate stack.

3. The method of claim 1 wherein forming the initial pitch multiplied feature pattern comprises lateral trimming of masking material from which the initial pitch multiplied feature pattern is made.

4. The method of claim 1 wherein the subsequent feature pattern is formed to be pitch multiplied within the target area.

5. The method of claim 4 wherein the subsequent feature pattern is formed to self-align relative to the initial pitch multiplied feature pattern in the target area.

6. The method of claim 5 wherein the subsequent feature pattern is formed to self-align between spacer material deposited laterally over sidewalls of the initial pitch multiplied feature pattern.

7. The method of claim 1 wherein said using comprises a subsequent pitch multiplication of the initial and subsequent feature patterns.

8. The method of claim 1 wherein said using comprises:
   transferring the initial and subsequent feature patterns to a first hard-mask;
   pitch multiplying the transferred initial and subsequent feature patterns;
   transferring the transferred pitch multiplied initial and subsequent feature patterns to a second hard-mask; and subsequently using the second hard-mask as an etch mask in forming the features in the underlying material by etching.

9. The method of claim 1 wherein the pitch multiplication of the initial pitch multiplied feature pattern is from about 4F to about 2F, where 1F is a minimum final feature width.

10. The method of claim 9 wherein the subsequent feature pattern is formed to be effectively pitch multiplied to about 2F within the target area.

11. A method of forming features of integrated circuitry comprising a target area having features which extend outwardly there-from to opposing first and second periphery areas on opposing sides of the target area, comprising:
   forming an initial feature pattern in a first hard-mask, the initial feature pattern comprising an initial pattern of lines which alternate every other line in extending from the target area to alternating of the first and second periphery areas;
   using the initial feature pattern in forming a subsequent feature pattern in a second hard-mask, the subsequent feature pattern comprising a subsequent pattern of lines which alternate in pairs of two immediately adjacent lines in extending from the target area to alternating of the first and second periphery areas; and
   transferring the subsequent feature pattern in the second hard-mask to an underlying material overlying the target area and the first and second periphery areas.

12. The method of claim 11 wherein the initial feature pattern comprises a word line pattern, the target area comprises a memory array area, the first and second periphery areas are control circuitry connection areas, the subsequent feature pattern comprises a subsequent word line pattern, and the underlying material comprises a gate stack.

13. The method of claim 11 comprising forming the two immediately adjacent lines within individual of the pairs to comprise different minimum widths outside of the target area.

14. The method of claim 11 comprising forming the two immediately adjacent lines within individual of the pairs to be equally spaced from one another along their respective lengths outside of the target area.

15. The method of claim 14 comprising forming immediately adjacent of the pairs to be equally spaced from one another along their respective lengths outside of the target area.

16. The method of claim 11 comprising:
   forming the two immediately adjacent lines within individual of the pairs to be equally spaced from one another at a first spacing along their respective lengths outside of the target area; and
   forming immediately adjacent of the pairs to be equally spaced from one another at a second spacing along their respective lengths outside of the target area, the second spacing being greater than the first spacing.

17. The method of claim 11 wherein forming the initial feature pattern comprises pitch multiplication.

18. The method of claim 11 wherein said using of the initial feature pattern comprises pitch multiplication.

19. The method of claim 11 wherein forming the initial feature pattern comprises initial pitch multiplication, and said using of the initial feature pattern comprises subsequent pitch multiplication.

20. The method of claim 19 wherein the initial pitch multiplication is from about 4F to about 2F and the subsequent pitch multiplication is from said about 2F to about 1F, where 1F is a minimum final feature width.

21. A method of forming features of integrated circuitry comprising a target area having features which extend outwardly there-from to opposing first and second periphery areas on opposing sides of the target area, comprising:
   using three, and only three, photomasking steps in defining longitudinal outlines of pitch quadrupled features in a hard-mask received within the target area and which individually extend to individual of the opposing first and second periphery areas; using a first of the three photomasking steps in forming an initial pitch multiplied feature pattern extending from the target area into only one of the first or second periphery areas; and
   transferring the longitudinal outlines of the pitch quadrupled features in the hard-mask to an underling material overlying the target area and the first and second periphery areas.

22. The method of claim 21 wherein the pitch quadrupled features are word lines, the target area comprises a memory array area, the first and second periphery areas are control circuitry connection areas, and the underlying material comprises a gate stack.

23. The method of claim 21 comprising using an intermediate of the three photomasking steps to form an intermediate feature pattern extending from the target area into only one of the first or second periphery areas.

24. The method of claim 21 comprising using a third of the three photomasking steps to form a tertiary feature pattern extending from the target area into the first and second periphery areas.

25. A method of forming features of integrated circuitry comprising a target area having features which extend outwardly there-from to opposing first and second periphery areas on opposing sides of the target area, comprising:
   forming an initial feature pattern extending from the target area into the first and second periphery areas, the initial feature pattern comprising an initial pattern of lines;
   forming spacer material over the initial feature pattern in the target area and in the first and second periphery areas;
   forming fill material over the spacer material in the target area and in the first and second periphery areas;
   forming an etch mask over the fill material, the etch mask comprising individual mask lines having opposing longitudinal edges within the first and second periphery areas, one of the edges of the individual mask lines overlying an individual of the lines of the initial pattern of lines, the other edge of the individual mask lines overlying fill material received between spacer material between immediately adjacent of the lines of the initial pattern of lines;
   using the etch mask, etching the fill material to form a subsequent feature pattern extending from the target area into the first and second periphery areas, the subsequent feature pattern comprising a subsequent pattern of lines individually having opposing longitudinal edges, one of the edges of the individual of the subsequent pattern of lines self-aligning in the first and second periphery areas along one longitudinal edge of spacer material received laterally on individual of the lines of the initial pattern of lines, the other of the edge of the individual of the subsequent pattern of lines in the first and second periphery areas being defined by the other edge of the individual mask lines overlying fill material received between spacer material between immediately adjacent of the lines of the initial pattern of lines;
   after forming the subsequent feature pattern, removing elevationally exposed spacer material from the target area and the first and second periphery areas;

after removing the elevationally exposed spacer material from the target area and the first and second periphery areas, transferring the initial and subsequent feature patterns to an underlying hard-mask material; and transferring the initial and subsequent feature patterns in the hard-mask material to material underlying the hard-mask material to form features in said underlying material.

26. The method of claim 25 wherein the initial feature pattern comprises a word line pattern, the target area comprises a memory array area, the first and second periphery areas are control circuitry connection areas, the subsequent feature pattern comprises a subsequent word line pattern, and the underlying material comprises a gate stack.

27. A method of forming features of integrated circuitry comprising a target area having features which extend outwardly there-from to opposing first and second periphery areas on opposing sides of the target area, comprising:

forming a first feature pattern over a first hard-mask material received over a second hard-mask material received over an underlying material, the first feature pattern extending from the target area into only one of the first or second periphery areas, the first feature pattern comprising a first pattern of lines having minimum lateral width of about 4F separated by about 4F spaces where about 1F is a minimum final feature width;

laterally trimming the first pattern of lines to form a second feature pattern extending from the target area into only said one first or second periphery area, the second feature pattern comprising a second pattern of lines having minimum lateral width of about 2F separated by about 6F spaces;

forming first spacer material to a thickness of about 2F over the second feature pattern and over the other of the first and second periphery areas;

forming first fill material over the first spacer material in the target area and in the first and second periphery areas;

forming a third feature pattern with the first fill material, the third feature pattern comprising first fill material over first spacer material, the third feature pattern extending from the target area into only said other first or second periphery area, the third feature pattern comprising a third pattern of lines which self-align and alternate with the second pattern of lines in the target area and have lateral width of about 2F in the target area, the third pattern of lines having minimum lateral width of about 4F separated by about 4F spaces in said other first or second periphery area;

after forming the third feature pattern, removing elevationally exposed first spacer material from the target area and said one first or second periphery area;

after removing the elevationally exposed first spacer material from the target area and said one first or second periphery area, transferring the second and third feature patterns to the first hard-mask material;

laterally trimming the second and third pattern of lines in the first hard-mask material to form a fourth feature pattern, the fourth feature pattern comprising a fourth pattern of lines having minimum lateral width of about 1F separated by about 3F spaces within the target area;

forming second spacer material to a thickness of about 1F over the fourth feature pattern in the target area and the first and second periphery areas;

forming second fill material over the second spacer material in the target area and in the first and second periphery areas;

forming a fifth feature pattern with the second fill material, the fifth feature pattern comprising second fill material over second spacer material, the fifth feature pattern extending from the target area into the first and second periphery areas, the fifth feature pattern comprising a fifth pattern of lines which self-align and alternate with the fourth pattern of lines of the first hard-mask material in the target area and have lateral width of about 1F in the target area;

after forming the fifth feature pattern, removing elevationally exposed second spacer material from the target area and the first and second periphery areas;

after removing the elevationally exposed second spacer material from the target area and the first and second periphery areas, transferring the fourth and fifth feature patterns to the second hard-mask material; and transferring the fourth and fifth feature patterns in the second hard-mask material to the underlying material to form lines in the underlying material within the target area having minimum lateral width of about 1F.

28. The method of claim 27 wherein the first feature pattern comprises a first word line pattern, the target area is a memory array area, the first and second periphery areas are control circuitry connection areas, the second feature pattern comprises a second word line pattern, the third feature pattern comprises a third word line pattern, the fourth feature pattern comprises a fourth word line pattern, the fifth feature pattern comprises a fifth word line pattern, and the underlying material comprises a gate stack.

* * * * *